(12) United States Patent
Chuang et al.

(10) Patent No.: US 12,069,963 B2
(45) Date of Patent: Aug. 20, 2024

(54) MAGNETIC RANDOM ACCESS MEMORY DEVICE AND FORMATION METHOD THEREOF

(71) Applicant: TAIWAN SEMICONDUCTOR MANUFACTURING COMPANY, LTD., Hsinchu (TW)

(72) Inventors: Harry-Hak-Lay Chuang, Hsinchu County (TW); Sheng-Chang Chen, Hsinchu County (TW); Hung Cho Wang, Taipei (TW); Sheng-Huang Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 418 days.

(21) Appl. No.: 17/461,243

(22) Filed: Aug. 30, 2021

(65) Prior Publication Data
US 2023/0061985 A1    Mar. 2, 2023

(51) Int. Cl.
*H10N 50/80* (2023.01)
*H10B 61/00* (2023.01)
*H10N 50/01* (2023.01)
*H10N 50/85* (2023.01)

(52) U.S. Cl.
CPC ............ *H10N 50/80* (2023.02); *H10B 61/00* (2023.02); *H10N 50/01* (2023.02); *H10N 50/85* (2023.02)

(58) Field of Classification Search
CPC ........ H10N 50/80; H10N 50/01; H10N 50/85; H10N 50/10; H10B 61/00; H10B 61/22
See application file for complete search history.

(56) References Cited

U.S. PATENT DOCUMENTS

| | | | |
|---|---|---|---|
| 9,419,208 B2* | 8/2016 | Whig | H10N 50/85 |
| 9,882,121 B2* | 1/2018 | Kuo | H10N 50/01 |
| 10,916,694 B2* | 2/2021 | Wang | H01L 21/76802 |
| 11,075,335 B2* | 7/2021 | Chuang | H01L 23/5226 |
| 2019/0140019 A1* | 5/2019 | Nagel | H10N 50/01 |
| 2020/0127194 A1* | 4/2020 | Rizzolo | H10N 50/10 |
| 2021/0233812 A1* | 7/2021 | Reznicek | H01L 21/76843 |
| 2021/0305499 A1* | 9/2021 | Xie | H10N 50/10 |
| 2022/0208604 A1* | 6/2022 | Zhu | C23C 16/0281 |

* cited by examiner

*Primary Examiner* — J. E. Schoenholtz
(74) *Attorney, Agent, or Firm* — Maschoff Brennan

(57) ABSTRACT

A MRAM device includes a substrate, a first bottom electrode, a first MTJ stack, a first spacer, a topography-smoothing layer and a second ILD layer. The substrate includes a first ILD layer having a metal line. The first MTJ stack is over the first bottom electrode. The first spacer surrounds sidewalls of the first MTJ stack. The topography-smoothing layer extends over a top surface of the first ILD layer, along sidewalls of the first bottom electrode the first spacer. The topography-smoothing layer has a top portion over the first MTJ stack and a first side portion laterally surrounding the first spacer. The first side portion has a maximal lateral thickness greater than a maximal vertical thickness of the top portion. The second ILD layer is over the topography-smoothing layer and has a material different from a material of the topography-smoothing layer.

20 Claims, 19 Drawing Sheets

MAGNETIC RANDOM ACCESS MEMORY DEVICE AND FORMATION METHOD THEREOF

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
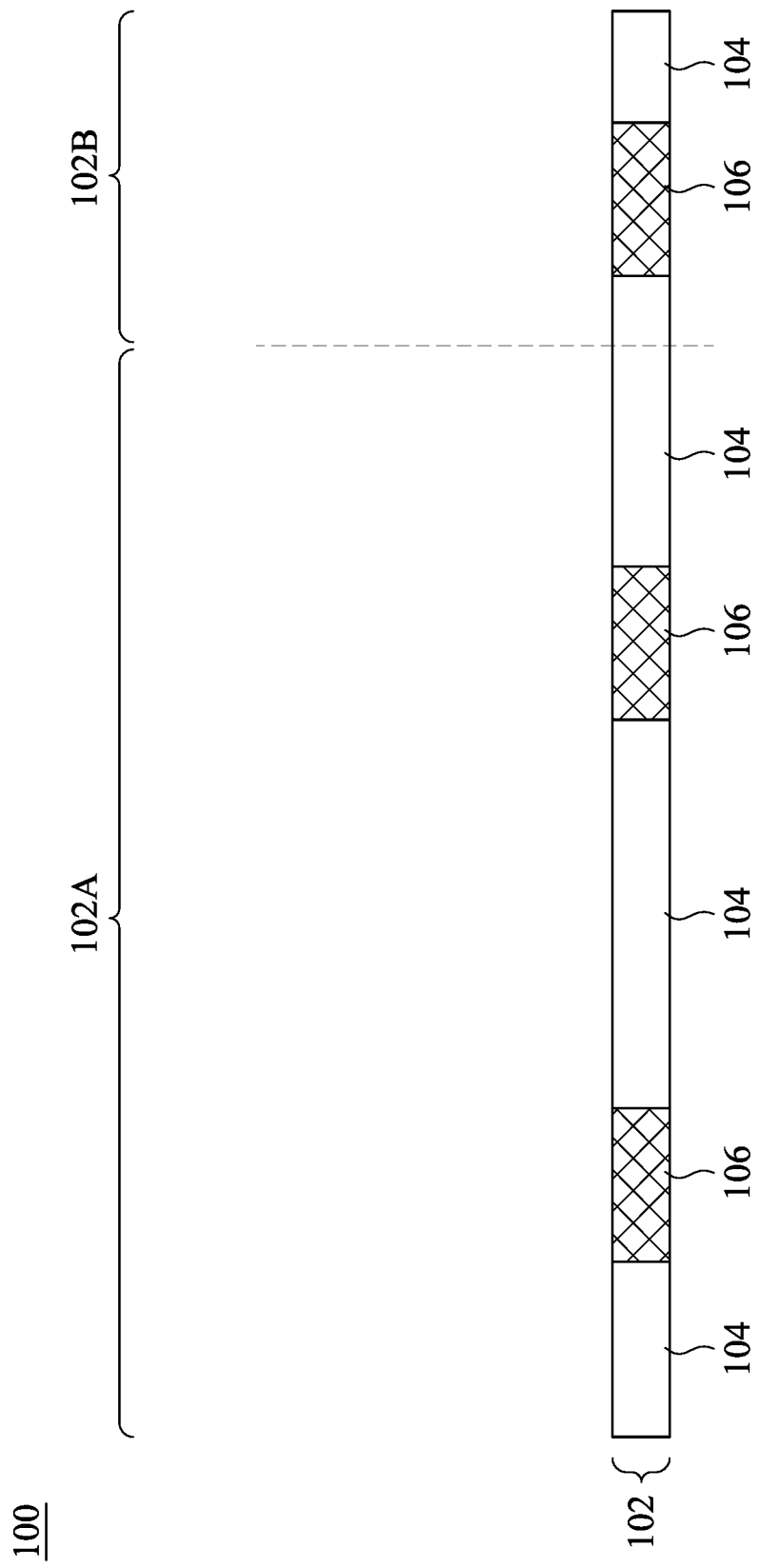
FIGS. 1-18 are cross-sectional views of the MRAM device at various intermediate stages of manufacture according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of this disclosure, a magnetoresistive random access memory (MRAM) device is formed. The MRAM device includes a magnetic tunnel junction (MTJ) stack. The MTJ stack includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the MTJ stack is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the MTJ stack is in a lower resistive state, corresponding to a digital signal "0". When the magnetic moment of the ferromagnetic free layer is anti-parallel to that of the ferromagnetic pinned layer, the resistance of the MTJ stack is in a higher resistive state, corresponding to a digital signal "1". The MTJ stack is coupled between top and bottom electrode and an electric current flowing through the MTJ stack (tunneling through the tunnel barrier layer) from one electrode to the other is detected to determine the resistance and the digital signal state of the MTJ stack.

According to some embodiments of this disclosure, the MRAM device is formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes, for example, silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIG. 1 is a cross-sectional view of a MRAM device 100 at an intermediate stage of manufacture according to various embodiments of the present disclosure. Reference is made to FIG. 1. In some embodiments, an interconnect structure 102 having an inter-layer dielectric (ILD) layer or inter-metal dielectric layer (IMD) layer 104 with a metallization pattern 106 (e.g., metal line) is formed over a substrate (not shown in FIG. 1). The interconnect structure 102 has a ferroelectric random access memory (FRAM) region 102A and a logic device region 102B. The FRAM region 102A can correspond to an array of memory cells (e.g., memory cell) while the logic device region 102B can couple logic devices, such as transistors formed in the interconnect structure 102, to support operation of the memory cells. The ILD layer 104 may be silicon oxide, fluorinated silica glass (FSG), carbon doped silicon oxide, tetra-ethyl-ortho-silicate (TEOS) formed oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 106 may be aluminum, aluminum alloy, copper, copper alloy, titanium, titanium nitride, tantalum, tantalum nitride, tungsten, the like, and/or combinations thereof. Formation of the metallization pattern 106 and the ILD layer 104 may be a dual-damascene process and/or a single-damascene process.

Figure 2:
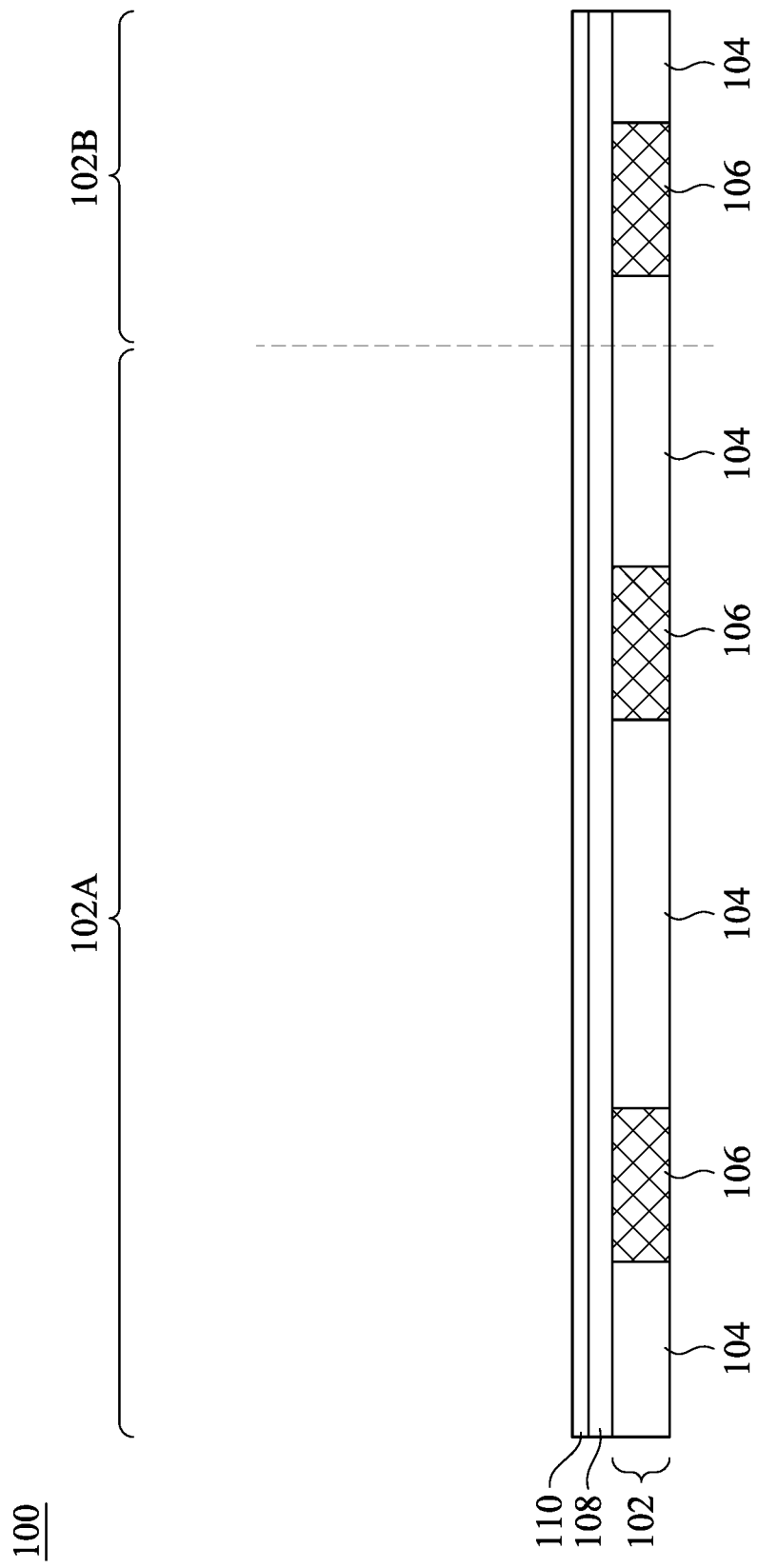

FIG. 2 is a cross-sectional view of the MRAM device 100 at an intermediate stage of manufacture according to various embodiments of the present disclosure. Reference is then made to FIG. 2. An etch stop layer 108 may be blanket formed over the interconnect structure 102. The etch stop layer 108 controls the end point of a subsequent etch process. In various embodiments, the etch stop layer 108 may be formed by a vapor deposition technique (e.g., physical vapor deposition, chemical vapor deposition, etc.) and include hydrogen and nitrogen doped carbide (HNDC), silicon nitride (SiN), silicon carbide (SiC), silicon oxycarbide (SiOC), and/or some other suitable materials. In some embodiments, a thickness of the etch stop layer 108 is in a range from about 100 Angstroms to about 150 Angstroms.

A first dielectric layer 110 is formed over the etch stop layer 108. The first dielectric layer 110 may be formed by acceptable deposition techniques, such as chemical vapor deposition (CVD), atomic layer deposition (ALD), physical vapor deposition (PVD), the like, and/or a combination thereof. A chemical-mechanical polish (CMP) process is optionally performed to the first dielectric layer 110, until a desirable thickness is achieved. The first dielectric layer 110 can be, for example, silicon rich oxide (SRO), silicon dioxide layer, silicon carbide layer, silicon nitride layer, silicon oxycarbide layer, silicon oxynitride layer, low-k dielectric (e.g., having a dielectric constant of less than about 3.9) layer, extreme low-k (ELK) dielectric (e.g., having a dielectric constant of less than about 2.5) layer, the like, or combinations thereof. In some embodiments, a thickness of the first dielectric layer 110 is in a range from about 150 Angstroms to about 250 Angstroms.

Figure 3:
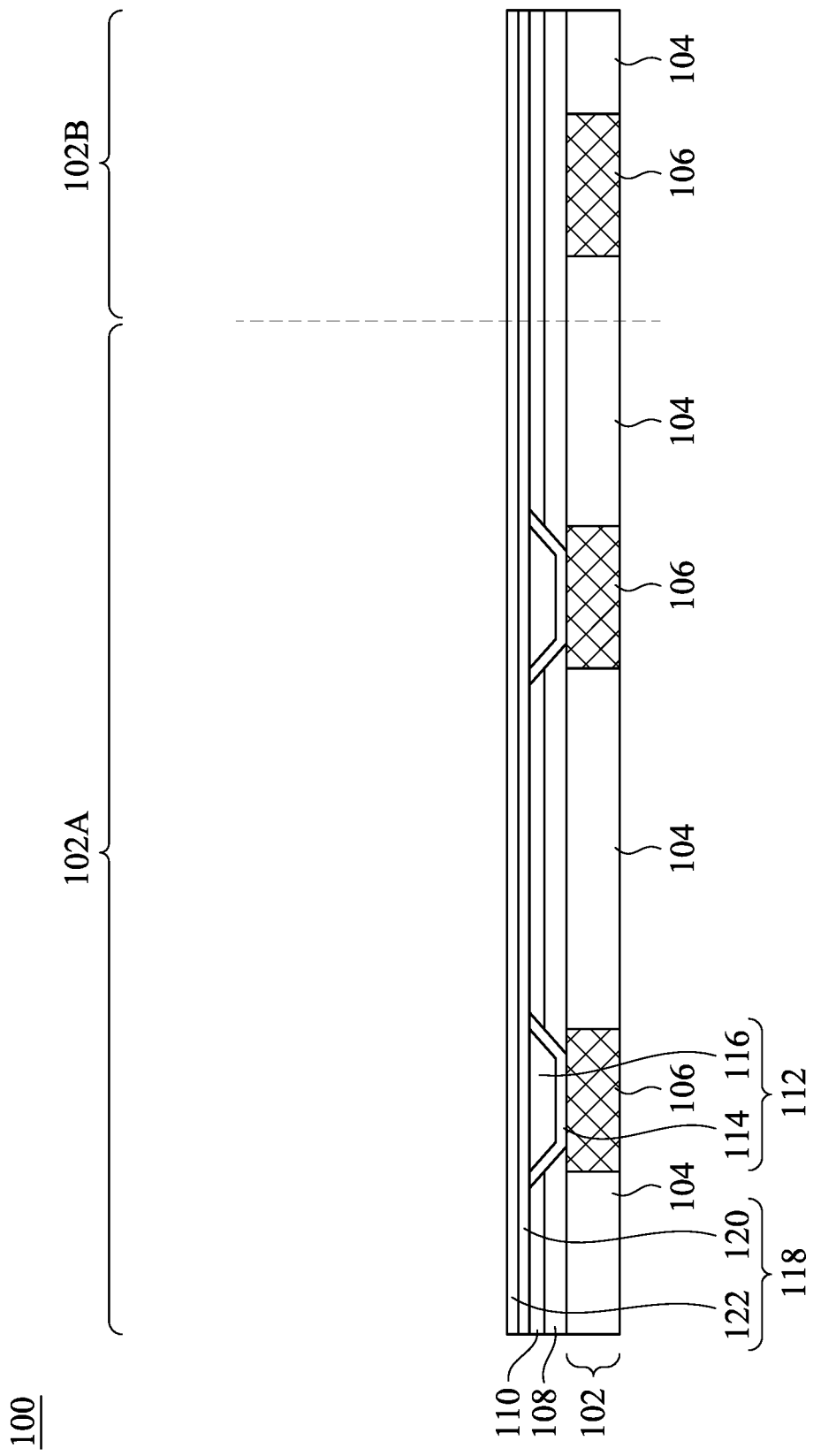
Figure 19:
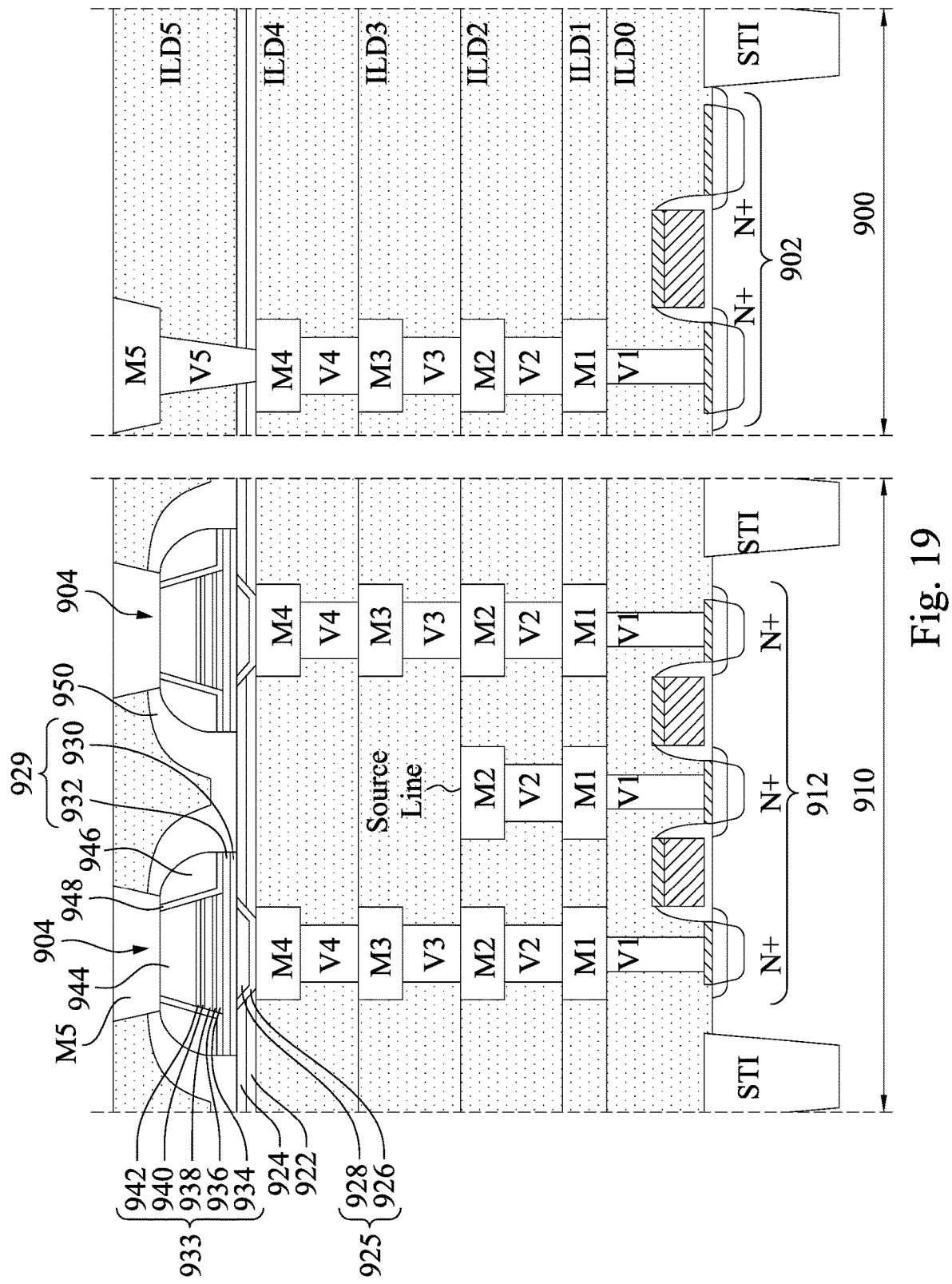
FIG. 19 illustrates an integrated circuit including MRAM devices and logic devices.

A bottom electrode via (BEVA) 112 is then formed within the first dielectric layer 110 and the etch stop layer 108, as illustrated in FIG. 3. In some embodiments, the BEVA 112 is a multi-layered structure and includes, for example, a diffusion barrier layer 114 and a filling metal 116 filling a recess in the diffusion barrier layer 114. An exemplary formation method of the BEVA 112 includes etching an opening in the first dielectric layer 110 and the etch stop layer 108, forming in sequence the diffusion barrier layer 114 and the filling metal 116 into the opening, and performing a planarization process, such as a CMP process, to remove excess materials of the filling metal 116 outside the opening in the first dielectric layer 110. The remaining diffusion barrier layer 114 and the remaining filling metal 116 in the opening in the first dielectric layer 110 and the etch stop layer can serve as the BEVA 112. In some other embodiments, the BEVA 112 has a concave top surface due to the dishing effect of the CMP process. In some embodiments, the BEVA 112 is electrically connected to an underlying electrical component, such as a transistor (e.g., transistor as shown in FIG. 19), through the back-end-of-line (BEOL) interconnect structure that includes the metallization pattern 106. In some embodiments, the filling metal 116 is titanium (Ti), tantalum (Ta), platinum (Pt), ruthenium (Ru), tungsten (W), aluminum (Al), copper (Cu), the like, and/or combinations thereof. Formation of the filling metal may be exemplarily performed using CVD, PVD, ALD, the like, and/or a combination thereof.

A bottom electrode layer 118 is then blank formed over the BEVA 112 and over the first dielectric layer 110, so that the bottom electrode layer 118 extends along top surfaces of the BEVA 112 and of the first dielectric layer 110. The bottom electrode layer 118 can be a multi-layered structure. For example, the bottom electrode layer 118 may be double-layered. In some embodiments, the bottom electrode layer 118 includes a TiN layer 120 and a TaN layer 122 over the TiN layer 120. Formation of the bottom electrode layer 118 may be exemplarily performed using CVD, PVD, ALD, the like, and/or a combination thereof. For example, the TiN layer 120 is deposited upon the first dielectric layer 110 and the BEVA 112, followed by planarizing a top surface of the deposited TiN layer 120, and the TaN layer 122 is then deposited on the planarized top surface of the TiN layer 120. In some embodiments, the TaN layer 120 has a thickness in a range from about 50 Angstroms to about 150 Angstroms. In some embodiments, the TiN layer 122 has a thickness in a range from about 50 Angstroms to about 150 Angstroms.

A magnetic tunnel junction (MTJ) layer stack 124 is formed over the bottom electrode layer 118. The MTJ layer stack 124 includes a seed layer 126, a ferromagnetic pinned layer 128, a tunneling layer 130, a ferromagnetic free layer 132, and a capping layer 134 formed in sequence over the bottom electrode layer 118. The seed layer 126 includes Ta, TaN, Cr, Ti, TiN, Pt, Mg, Mo, Co, Ni, Mn, or alloys thereof, and serves to promote a smooth and uniform grain structure in overlying layers. The seed layer 126 may have a thickness in a range from about 10 Angstroms to about 30 Angstroms in some embodiments. The ferromagnetic pinned layer 128 may be formed of an anti ferromagnetic (AFM) layer and a pinned ferroelectric layer over the AFM layer. The AFM layer is used to pin or fix the magnetic direction of the overlying pinned ferroelectric layer. The ferromagnetic pinned layer 128 may be formed of, for example, ferroelectric metal or alloy (e.g., Co, Fe, Ni, B, Mo, Mg, Ru, Mn, Ir, Pt, or alloys thereof).

The tunneling layer 130 is formed over the ferromagnetic pinned layer 128. The tunneling layer 130 is thin enough that electrons are able to tunnel through the tunneling layer 130 when a biasing voltage is applied on a resulting MTJ stack 124a fabricated from the MTJ layer stack 124 (see FIG. 7). In some embodiments, the tunneling layer 130 includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$), or combinations thereof. Exemplary formation methods of the tunneling layer 130 include sputtering, PVD, ALD, or the like.

Figure 4:
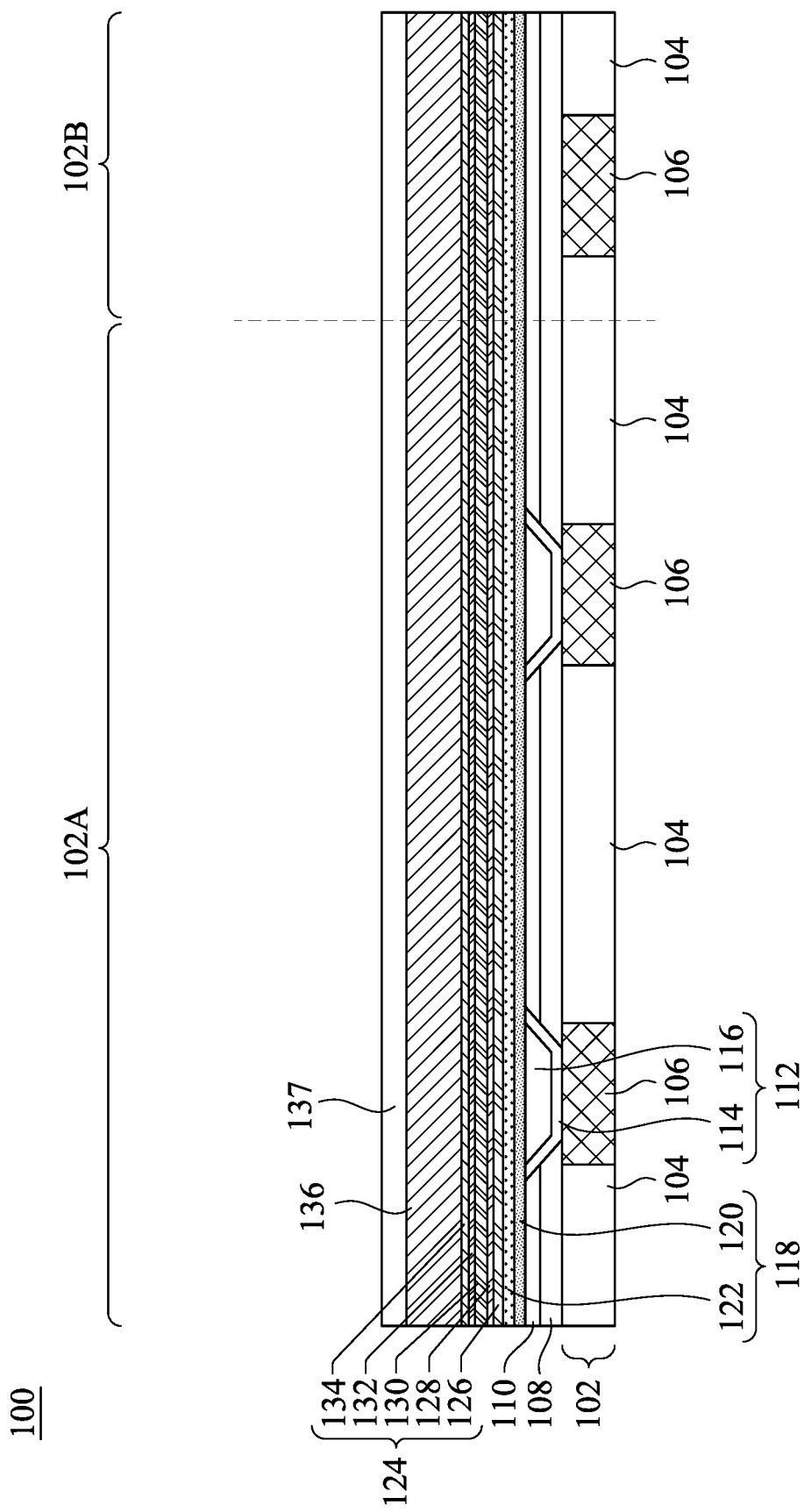

Still referring to FIG. 4, the ferromagnetic free layer 132 is formed over the tunneling layer 130. A direction of a magnetic moment of the ferromagnetic free layer 132 is not pinned because there is no anti-ferromagnetic material adjacent the ferromagnetic free layer 132. Therefore, the magnetic orientation of this layer 132 is adjustable, thus the layer 132 is regarded as a free layer. In some embodiments, the direction of the magnetic moment of the ferromagnetic free layer 132 is free to rotate parallel or anti-parallel to the pinned direction of the magnetic moment of the ferromagnetic pinned layer 128. The ferromagnetic free layer 132 may include a ferromagnetic material similar to the material in the ferromagnetic pinned layer 128. In some embodiments, the ferromagnetic free layer 132 includes Co, Fe, B, Mo, or combinations thereof. Exemplary formation methods of the ferromagnetic free layer 132 include sputtering, PVD, ALD, or the like. A total thickness of the ferromagnetic pinned layer 128, the tunneling layer 130, and the ferromagnetic free layer 132 is in a range from about 200 Angstroms to about 250 Angstroms.

The capping layer 134 is deposited over the ferromagnetic free layer 132. The capping layer 134 includes Ta, Co, B, Ru, Mo, MgO, AlO, or combinations thereof. In some embodiments, a thickness of the capping layer 134 is in a range from about 20 Angstroms to about 40 Angstroms. The capping layer 134 may be deposited by PVD or alternatively other suitable processes.

A top electrode layer 136 is formed on the capping layer 134. In some embodiments, the top electrode layer 136 includes Ti, Ta, Ru, W, TaN, TiN, the like or combinations thereof. An exemplary formation method of the top electrode layer 136 includes sputtering, PVD, ALD or the like.

A hard mask layer 137 is formed over the top electrode layer 136. In some embodiments, the hard mask layer 137 may be silicon carbide (SiC), silicon oxynitride (SiON), silicon nitride (SiN), silicon dioxide ($SiO_2$), the like, and/or combinations thereof. The hard mask layer 137 may be formed by acceptable deposition techniques, such as CVD, ALD, PVD, the like, and/or combinations thereof.

Figure 5:
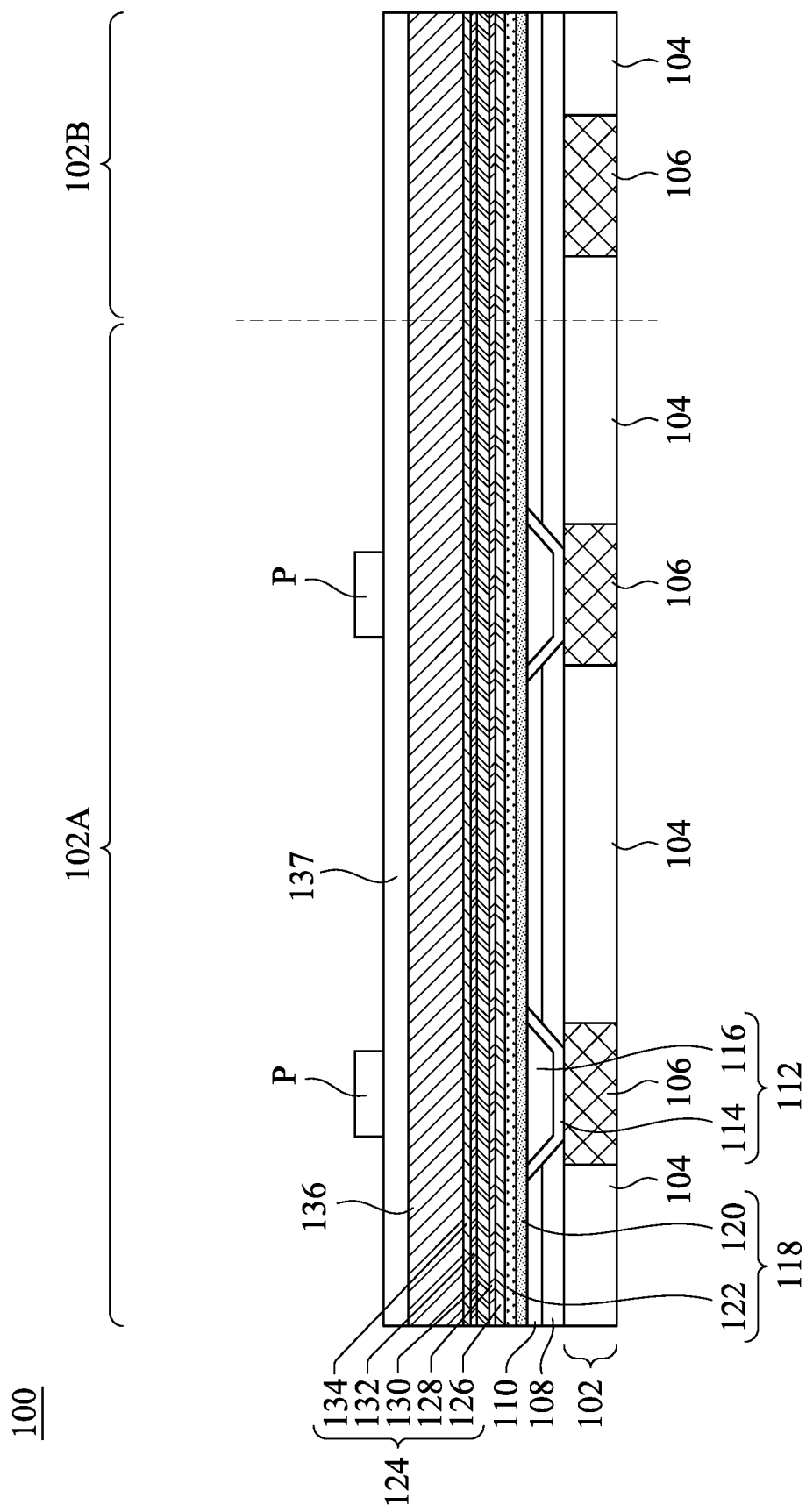

Reference is made to FIG. 5. A patterned resist mask P is formed over the hard mask layer 137. A resist layer is formed over the hard mask layer 137 and then patterned into a patterned resist mask P using a suitable photolithography process, such that portions of the hard mask layer 137 are exposed by the patterned resist mask P. In some embodiments, the patterned resist mask P is a photoresist. In some embodiments, the patterned resist mask P is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

Figure 6:
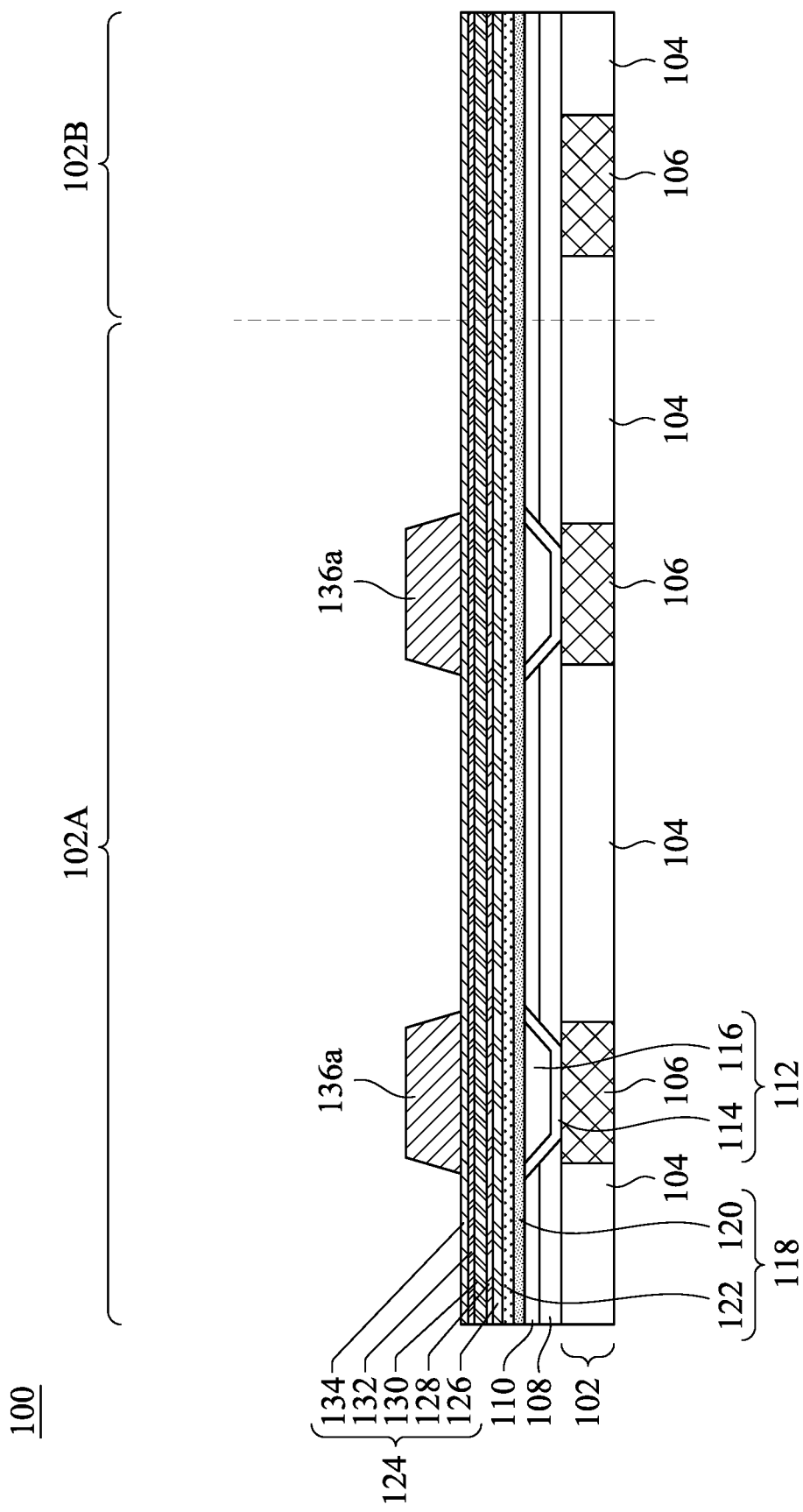

Referring to FIG. 6, the hard mask layer 137 and the underlying top electrode layer 136 are then etched, and hence forming top electrodes 136a. The patterned resist mask P and the hard mask layer 137 are then removed using suitable processes such as ashing and/or etching. The top electrodes 136a are used as etch masks for patterning the underlying layers.

Figure 7:
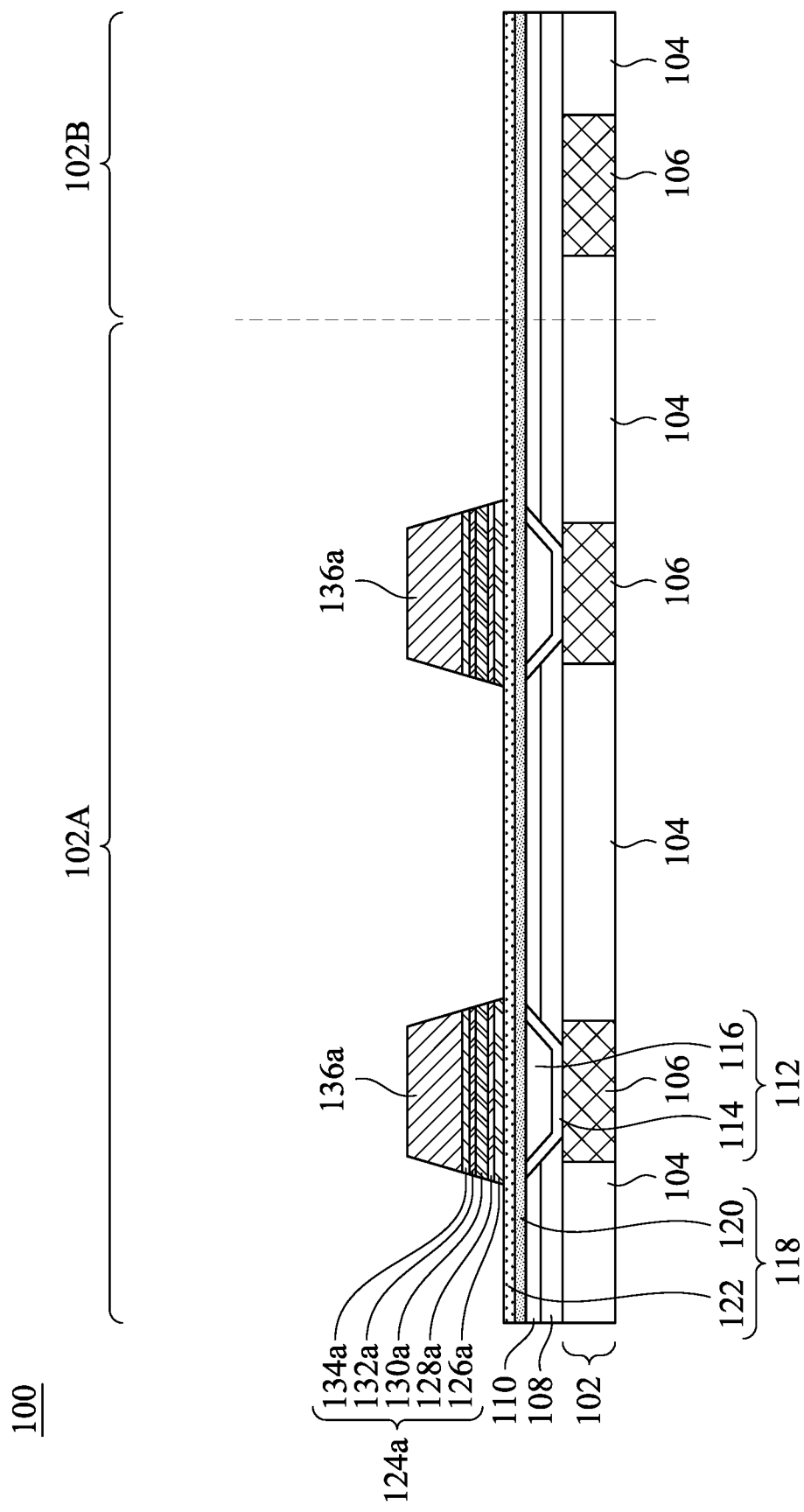

As shown in FIG. 7, an etching process is performed to pattern the MTJ layer stack 124 using the top electrodes 136a as etch masks. In greater detail, the etching process removes portions of the MTJ layer stack 124 not protected by the top electrodes 136a. After the etching process, remaining capping layers 134a, remaining ferromagnetic free layers 132a, remaining tunneling layers 130a, remaining ferromagnetic pinned layers 128a, and remaining seed layers 126a are in combination referred to as MTJ stacks 124a.

Figure 8:
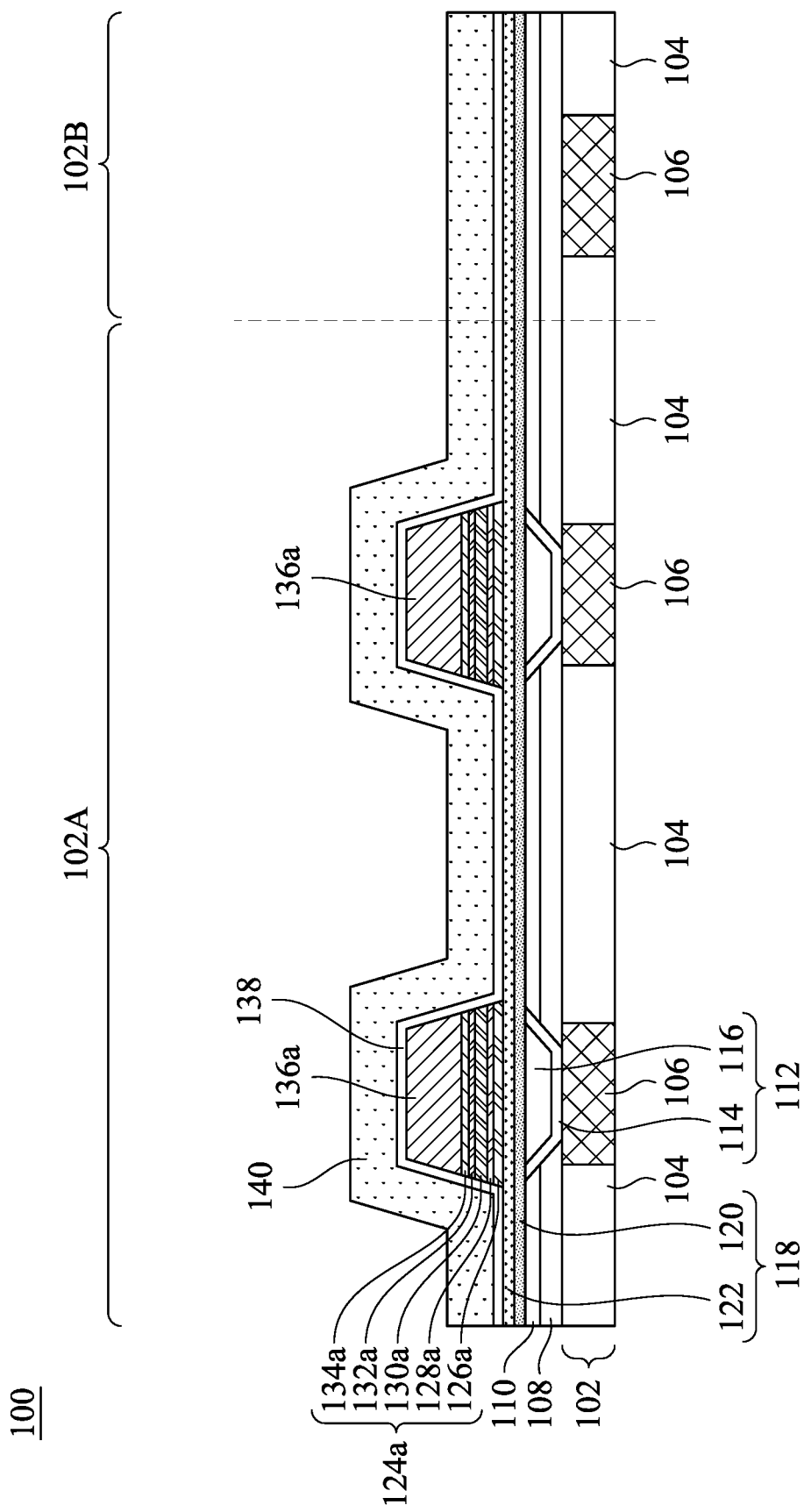

Reference is made to FIG. 8. A spacer layer 138 and a spacer layer 140 are conformally formed on the bottom electrode layer 118 and the top electrodes 136a in sequence. For example, the spacer layer 138 extends from the bottom electrode layer 118 and along a sidewall of the MTJ stack 124a, a sidewall of the top electrode 136a and over a top over the top electrode 136a. In some embodiments, the spacer layer 138 is made of a material different from a material of the spacer layer 140. For example, the spacer layer 138 is made of a silicon nitride, and the spacer layer 140 is made of a silicon oxide, such as a TEOS oxide. In these cases, the spacer layers 138 and 140 may be formed by a CVD process, an LPCVD process, a PECVD process, a HDPCVD process, or another suitable method. The spacer layer 140 has a thickness different from a thickness of the spacer layer 138 in this embodiment. For example, the thickness of the spacer layer 140 is greater than a thickness of the spacer layer 138.

Figure 9:
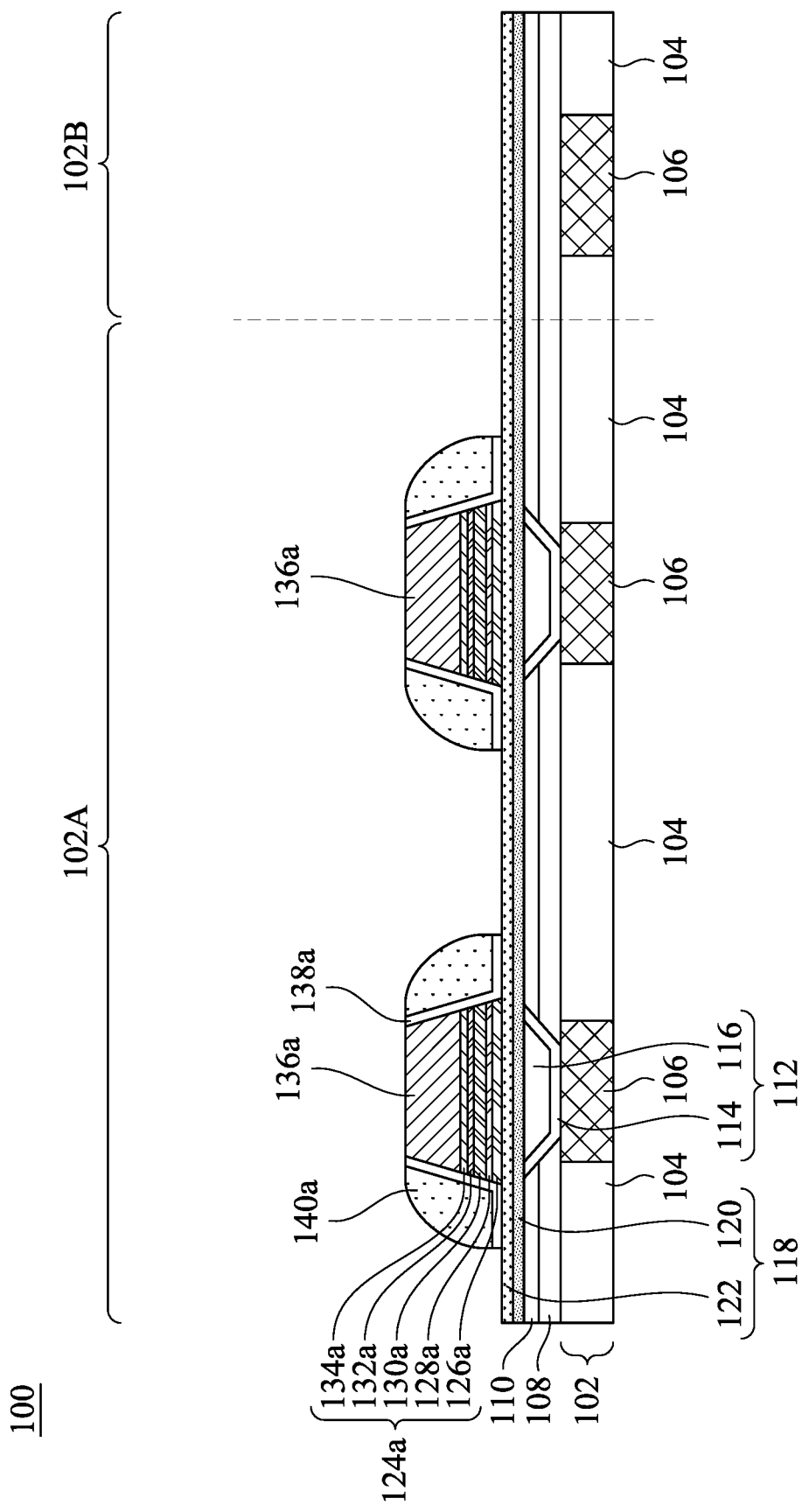

Reference is made to FIG. 9. An anisotropic etching process is performed on the spacer layers 138 and 140 to form spacers 138a and spacers 140a, respectively. Each spacers 138a and 140a surrounds sidewalls of the corresponding MTJ stacks 124a. After the anisotropic etching process, a top surface of the top electrode 136a and a top surface of the bottom electrode layer 118 are exposed.

Figure 10:
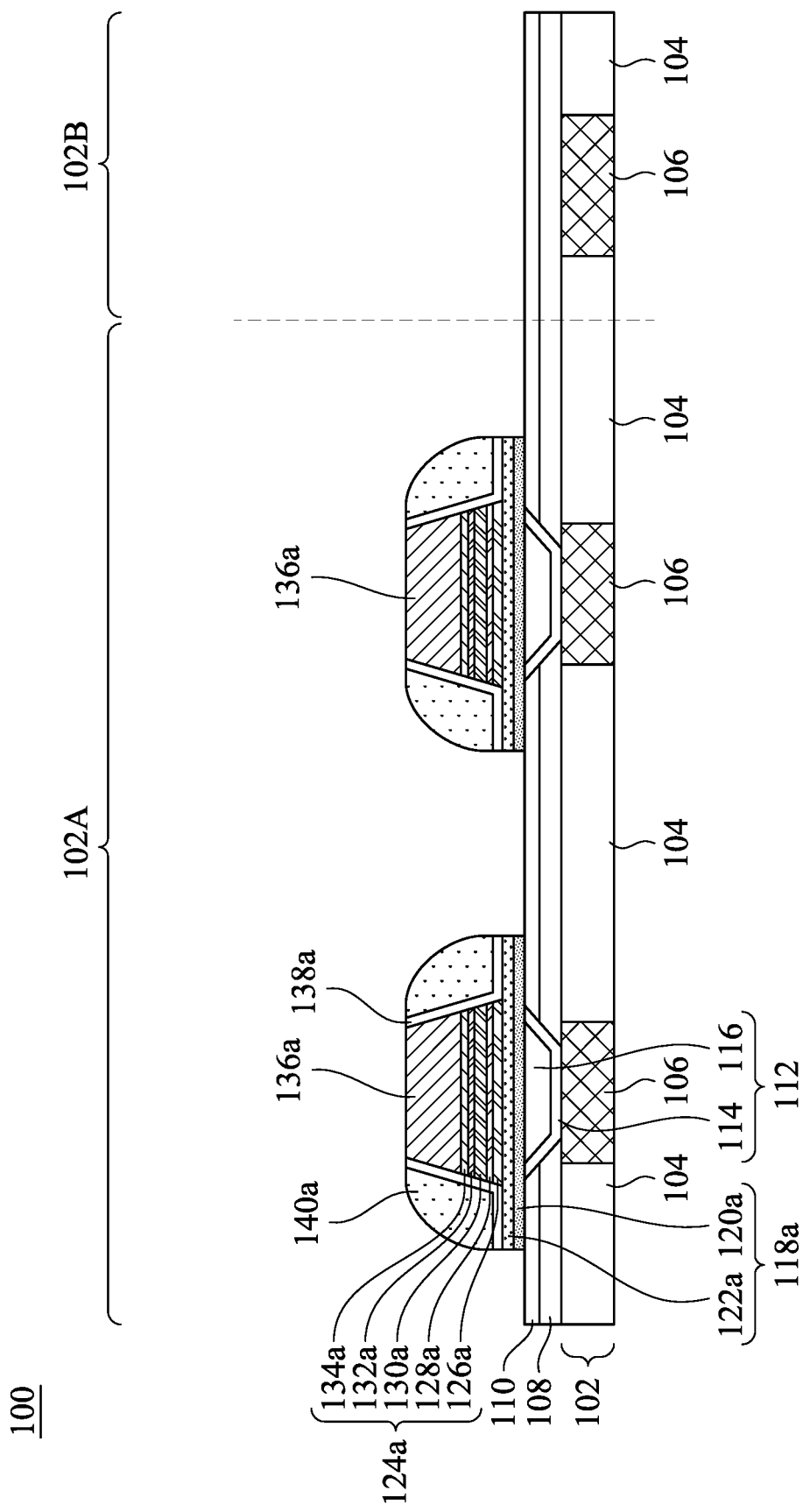

Reference is made to FIG. 10. An etching process is performed to pattern the bottom electrode layer 118. The first dielectric layer 110 is exposed after patterning the bottom electrode layer 118. For example, the bottom electrode layer 118 is patterned using the MTJ stacks 124a and the spacers 138a and 140a as an etch mask. The bottom electrode layer 118 is patterned as a bottom electrode 118a under the MTJ stack 124a. After the etching process, remaining TaN layer 122a and remaining TiN layer 120a are in combination regarded as the bottom electrode 118a.

Figure 11:
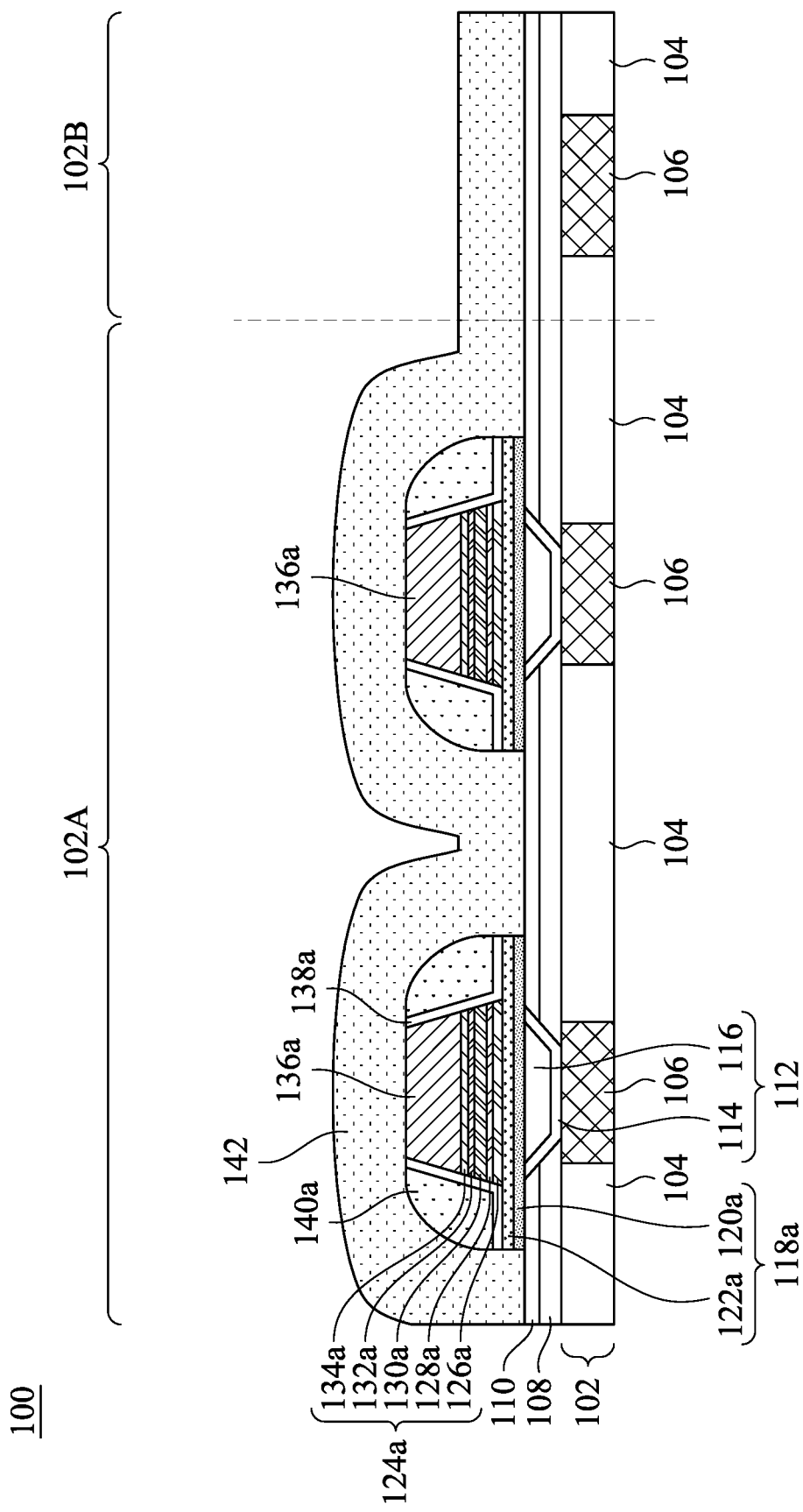

Reference is made to FIG. 11. A topography-smoothing material 142 is formed over the structure in FIG. 10. For example, the topography-smoothing material 142 is conformally formed over the top surface of the first dielectric layer 110, sidewalls of the bottom electrodes 118a, sidewalls and top surfaces of the spacers 138a and 140a and the top surface of the top electrode 136a. In some embodiments, the topography-smoothing material 142 is made of silicon oxide, silicon nitride or silicon carbide and is formed using plasma enhanced atomic layer deposition (PEALD). The topography-smoothing material 142 is beneficial for improving a coating quality of a subsequently formed layer (e.g., barrier layer 152 in FIG. 15) and thus undesired voids in the barrier layer 152 (see FIG. 15) can be prevented, which will be discussed in more detail below.

Figure 12:
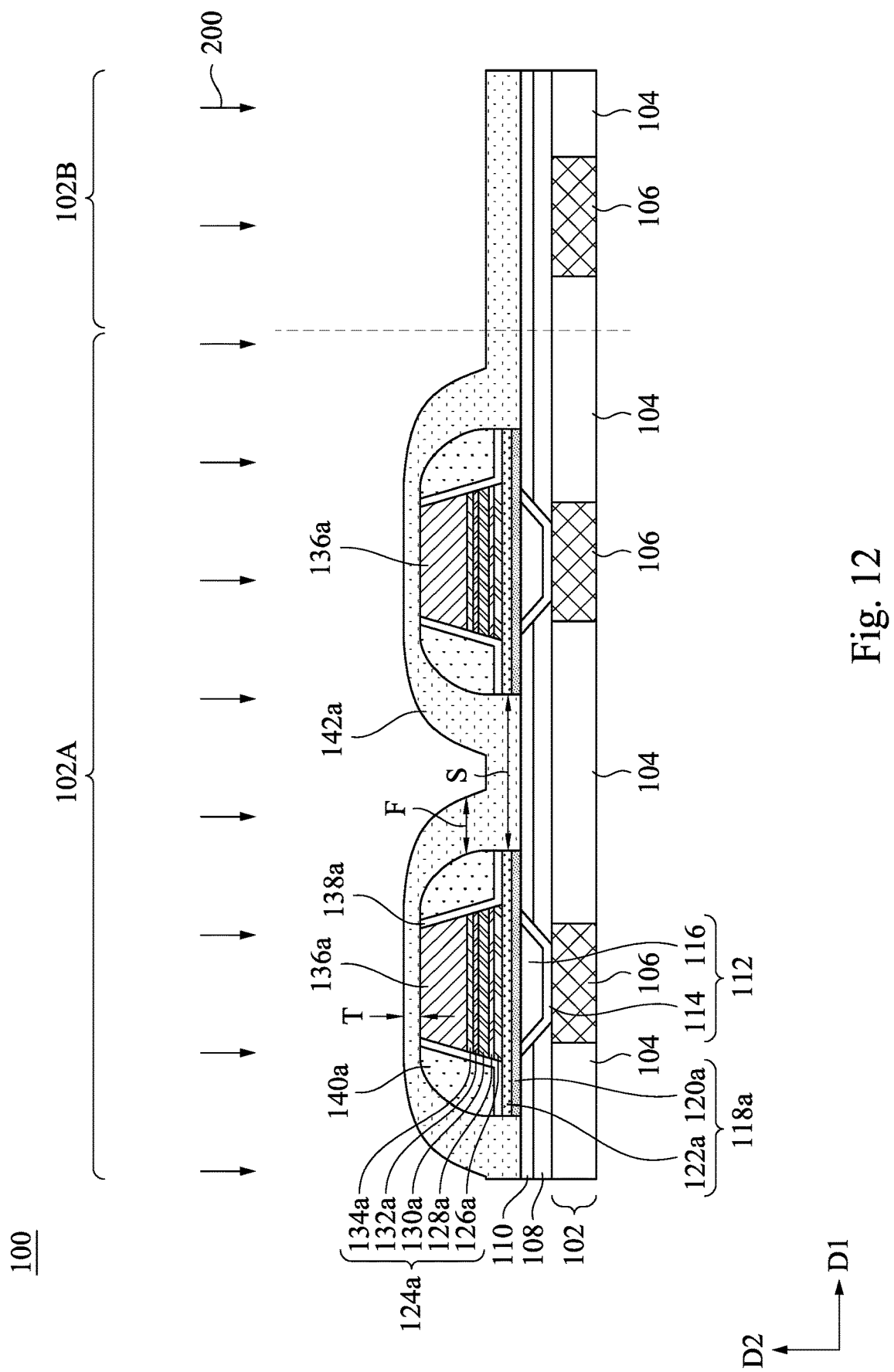

Reference is made to FIG. 12. An etching back process 200 is performed to the topography-smoothing material 142 to form a topography-smoothing layer 142a. A portion of the dielectric material is thus removed. In other words, the topography-smoothing material 142 is thinned. That is, the resulting topography-smoothing layer 142a has a thickness less than a thickness of the topography-smoothing material 142. After the etching back process 200, the topography-smoothing layer 142a remains over the logic device region 102A. The topography-smoothing layer 142a has a thickness in a range from about 50 Å to about 1500 Å. If the thickness of the topography-smoothing layer 142a is greater than 1500 Å, a process window during forming a subsequent via (e.g., via for filling upper metallization patterns 156 therein in FIG. 18) may be reduced. If the thickness of the topography-smoothing layer 142a is less than 50 Å, voids may be formed in a subsequent formed layer (e.g. the barrier layer 152 in FIG. 15). Such voids may lead to formation of concave defects on a top of the ILD layer 146 (see FIG. 17).

For example, the topography-smoothing layer 142a has a top portion over the MTJ stack 124a and a side portion laterally surrounding the spacer 140a. The side portion of the topography-smoothing layer 142a has a maximal lateral thickness F laterally measured from an outermost sidewall of the spacer 140a. The top portion of the topography-smoothing layer 142a has a maximal vertical thickness T different from the lateral maximal thickness F of the side portion of the dielectric layer. For example, the maximal lateral thickness F of the side portion is greater than the maximal vertical thickness of the top portion. In particular, the maximal lateral thickness F of the side portion of the topography-smoothing layer 142a refers to a distance from an outer surface of the side portion of the topography-smoothing layer 142a to an outer surface of the spacer 140a measured in a horizontal direction D1. The maximal vertical thickness T of the top portion of the topography-smoothing layer 142a refers to a distance between the top surface of the top electrode 136a and a top surface of the topography-smoothing layer 142a directly over the top electrode 136a measured in a vertical direction D2. The neighboring MTJ stacks 124a are spaced apart by a spacing S along the horizontal direction D1. The spacing S refers to a distance between the bottom electrode 118a underlying each of the neighboring MTJ stacks 124a measured in the horizontal direction D1. A first ratio of the maximal lateral thickness F of the side portion of the topography-smoothing layer 142a to the spacing S equals to about 0.01 to about 1, such as 0.25 to 7 in some embodiments. If the first ratio is out of this range, the process window during forming a subsequent via (e.g., via for filling upper metallization patterns 156 therein in FIG. 18) may be disadvantageously affected. A second ratio of the maximal vertical thickness T of the top portion of the topography-smoothing layer 142a to the spacing S equals to about 0 to about 0.5, such as 0.1 to 0.2 in some embodiments. If the second ratio is out of this range, the top electrode 136a may be damaged.

Figure 13:
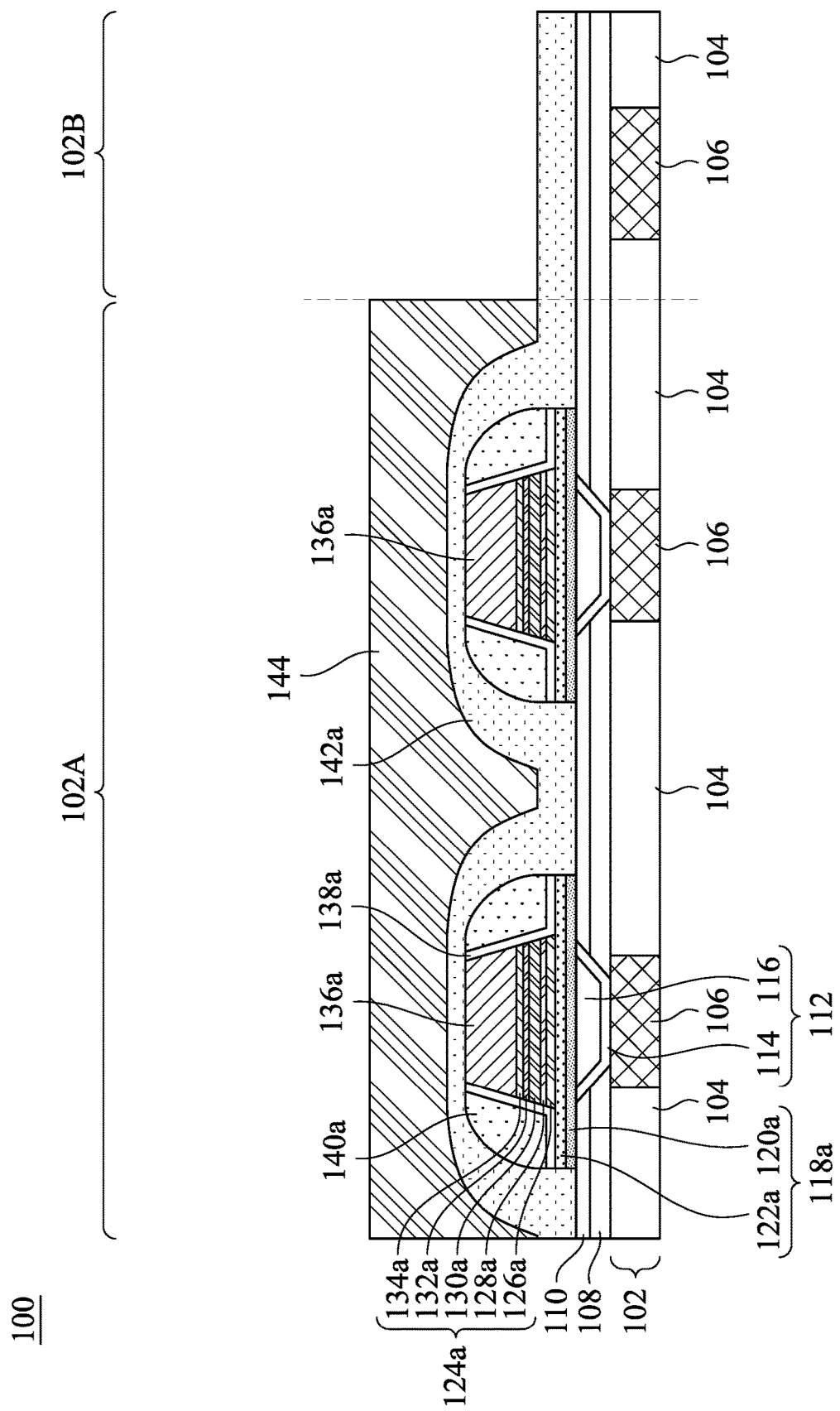

Reference is made to FIG. 13. A patterned photoresist 144 is spin-on coated on the topography-smoothing layer 142a over the FRAM region 102A. The patterned photoresist 144 is used as an etch mask to protect desired portions of the topography-smoothing layer 142a. For example, a portion of the topography-smoothing layer 142a over the FRAM region 102A is protected, and another portion of the topography-smoothing layer 142a over the logic device region 102B is exposed.

Figure 14:
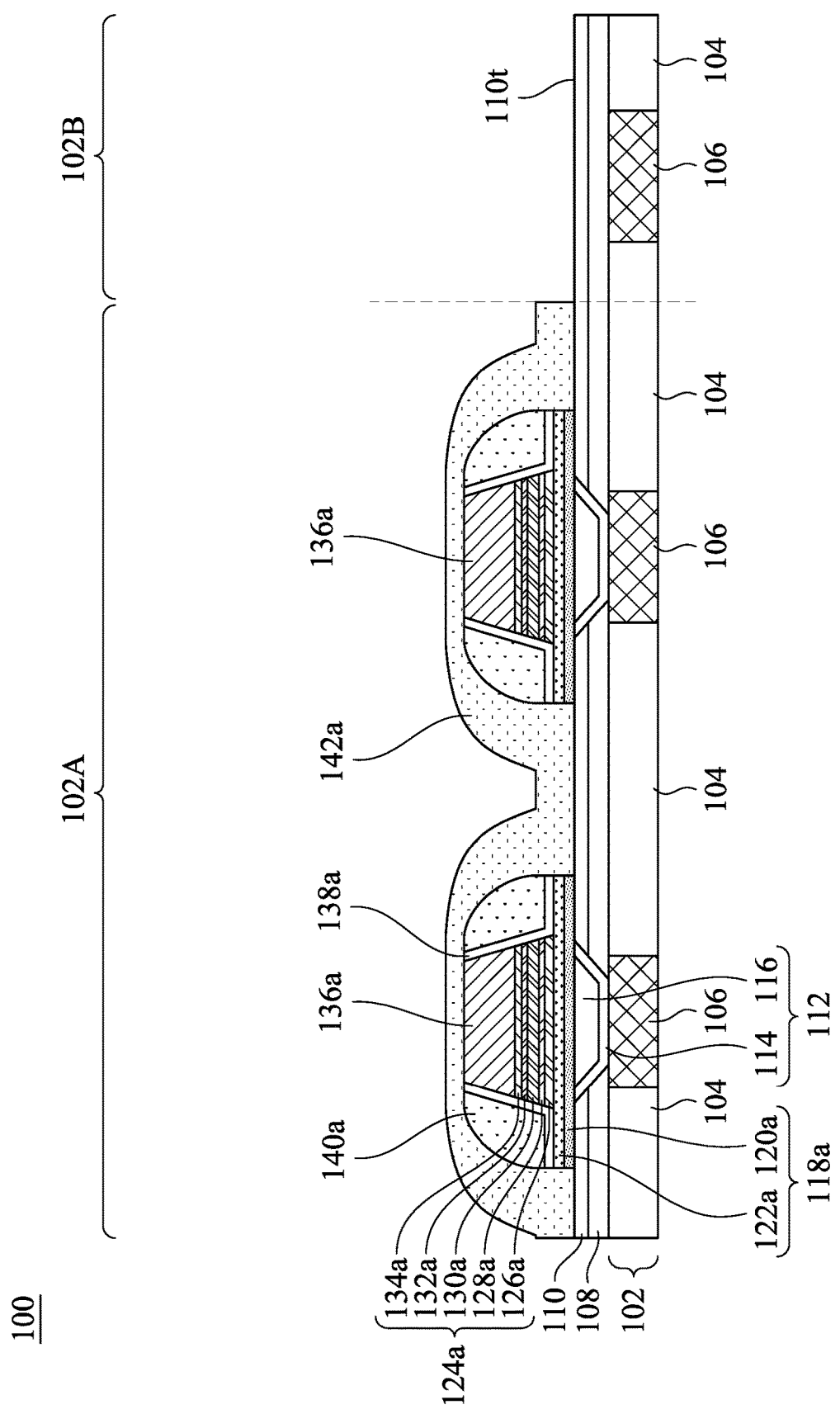

The topography-smoothing layer 142a over the logic device region 102B is removed, as shown in FIG. 14. Therefore, a top surface 110t of the first dielectric layer 110 is exposed. In some embodiments, the topography-smoothing layer 142a may be removed using a dry etching, a wet etching, or a combination thereof. As shown in FIG. 14, the MTJ stacks 124a are present over the FRAM region 102A and are absent from the logic device region 102B. The topography of the layers over the FRAM region 102A has ups and downs due to the MTJ stacks 124a as compared to the layers over the logic device region 102B. Because the maximal lateral thickness F (see FIG. 12) of the side portion of the topography-smoothing layer 142a is greater than the maximal vertical thickness T of the top portion of the dielectric layer 142a, a topography of such layers over the FRAM region 102A can be smoothed. In some embodiments, the topography-smoothing layer 142a has a bottom portion under the side portion of the topography-smoothing layer 142a. The side portions of the topography-smoothing layer 142a between the neighboring MTJ stacks 124a and the bottom portion of the topography-smoothing layer 142a in combination form a U-shaped cross-section. The bottom portion of the topography-smoothing layer 142a has a maximal vertical thickness greater than the maximal vertical thickness T (see FIG. 12) of the top portion of the topography-smoothing layer 142a. Such configuration is also beneficial for smoothing the topography of the layers over the FRAM region 102A.

Figure 15:
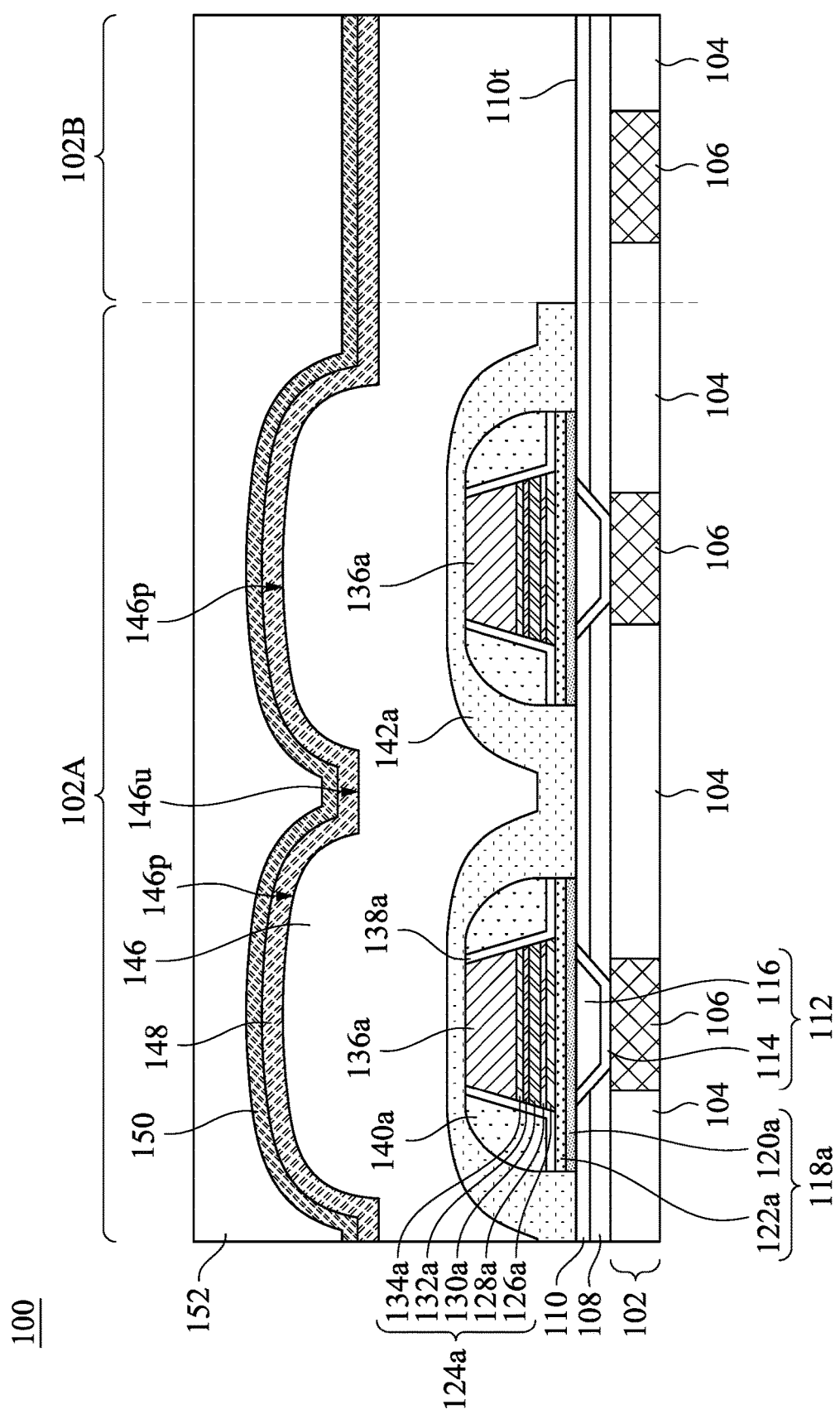

Reference is made to FIG. 15. An inter-layer dielectric (ILD) layer 146, a pad oxide layer 148, an etch stop layer 150 and a barrier layer 152 are formed over the structure in FIG. 14 in sequence. For example, the ILD layer 146 covers the topography-smoothing layer 142a over the FRAM region 102A and covers the first dielectric layer 110 over the logic device region 102B. The pad oxide layer 148 and the etch stop layer 150 are conformally formed over the ILD layer 146 and may be formed by a variety of techniques, such as chemical vapor deposition (CVD), low-pressure CVD (LPCVD), plasma-enhanced CVD (PECVD), sputtering and physical vapor deposition (PVD), thermal growing, or the like. The ILD layer 146 and the barrier layer 152 may be formed using chemical vapor deposition (CVD) such as LPCVD, PECVD, and flowable CVD (FCVD). The material of the ILD layer 146 and the material of the topography-smoothing layer 142a are different and thus an interface between the ILD layer 146 and the topography-smoothing layer 142a is present.

In some embodiments, the ILD layer 146 may have the same material as the ILD layer 104. In some other embodiments, the ILD layer 146 may have a different material than the ILD layer 104. In some embodiments, the ILD layer 146 includes extreme low-k dielectric material such as silicon oxide, fluorinated silica glass (FSG), carbon doped silicon oxide, tetra-ethyl-ortho-silicate (TEOS) formed oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof.

As mentioned above, the topography of the layers over the FRAM region 102A has ups and downs due to the MTJ stacks 124a as compared to the layers over the logic device region 102B. Therefore, the ILD layer 146 has raised portions 146p directly over the MTJ stacks 124a, respectively. In other words, the raised portions 146p are convex portions. A portion of the ILD layer 146 between the raised portions 146p can be referred to an un-raised portion 146u. The raised portion 146p has a reduced aspect ratio due to the underlying topography-smoothing layer 142a. Therefore, an elevation difference between a top surface of the raised portion 146p and a top surface of the un-raised portion 146u of the ILD layer 146 can be reduced. As a result, the barrier layer 152 overlying the ILD layer 146 can fully fill a region between the raised portions 146p without forming voids.

Figure 16:
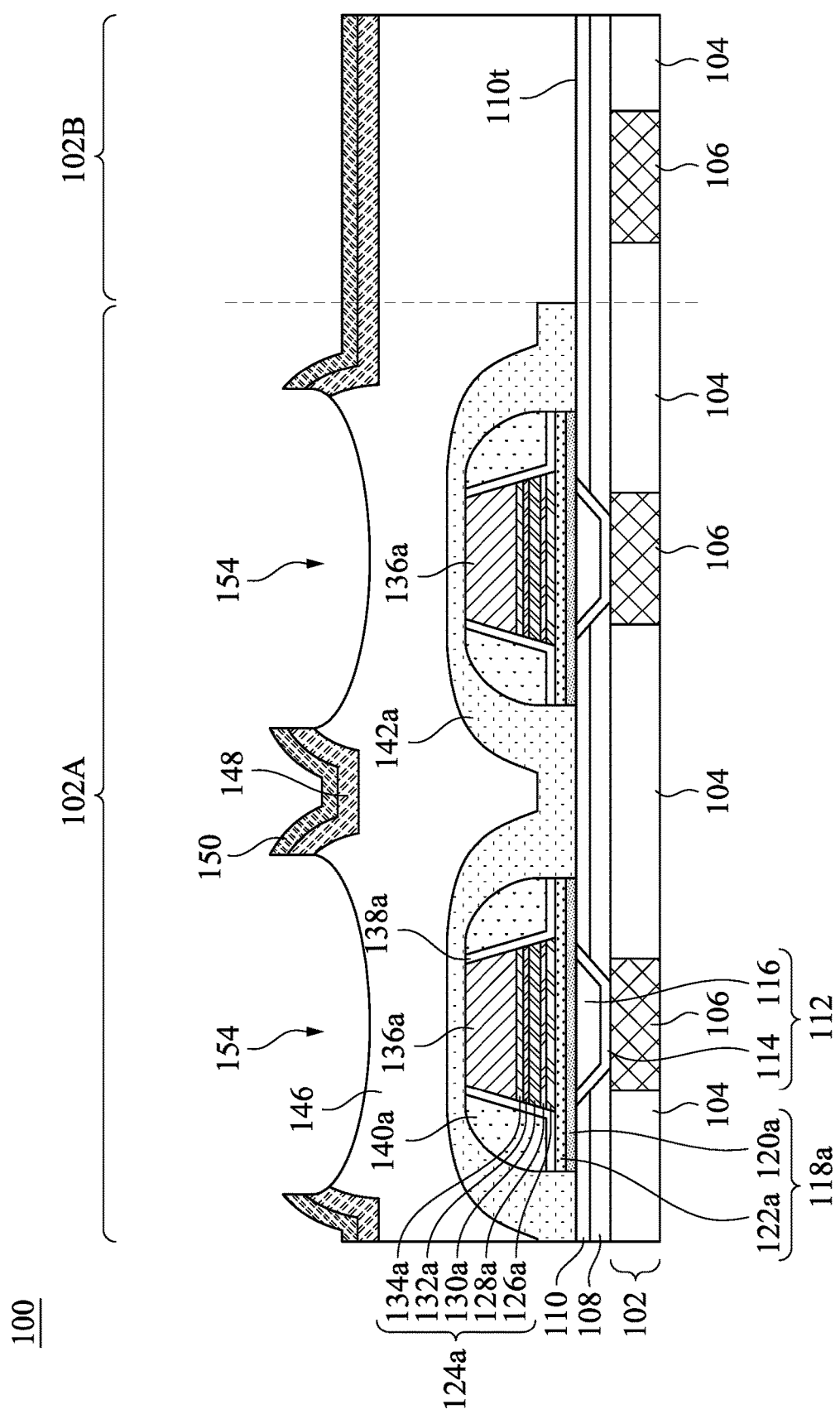

Reference is made to FIG. 16. The barrier layer 152 and the ILD layer 146 are etched back to expose the ILD layer 146. In this embodiment, the ILD layer 146 is recessed. For example, recesses 154 are formed in the ILD layer 146 directly over the MTJ stacks 124a. As mentioned above, because the voids are absent from the barrier layer 152, during etching back the barrier layer 152 and the ILD layer 146, the un-raised portion 146u of the ILD layer 146 would not be damaged.

Figure 17:
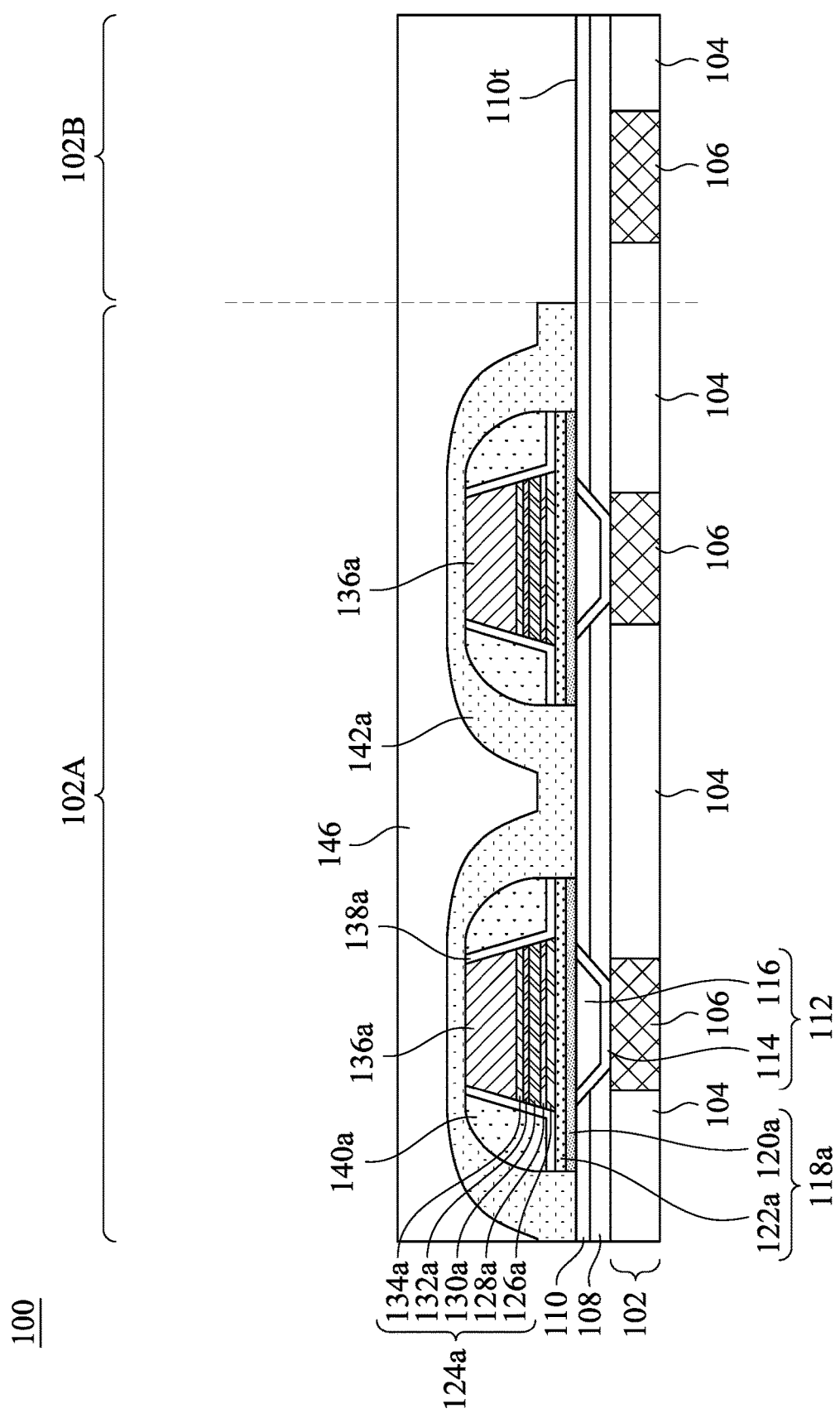

Reference is made to FIG. 17. The remaining portions of the barrier layer 152, the etch stop layer 150, the pad oxide layer 148 and a top portion of the ILD layer 146 are removed, for example, through a CMP process. The ILD layer 146 has a uniform top surface. As mentioned before, the topography-smoothing layer 142a has a portion between the neighboring MTJ stacks 124a having U-shaped cross-section. For example, the topography-smoothing layer 142a has a recessed region and the ILD layer 146 has a portion embedded in the recessed region. In some embodiments, the portion of the ILD layer 146 filling into the recess has a width, which is along the horizontal direction D1, decreasing in a direction toward the substrate 102. The ILD layer 146 and the topography-smoothing layer 142a have a bottommost interface at an elevation higher than a top surface of the bottom electrode 118a. The ILD layer 146 has a first portion over the FRAM region 102A and a second portion over the logic device region 102B, the first portion has a bottommost surface at an elevation higher than a bottommost surface of the second portion.

Figure 18:
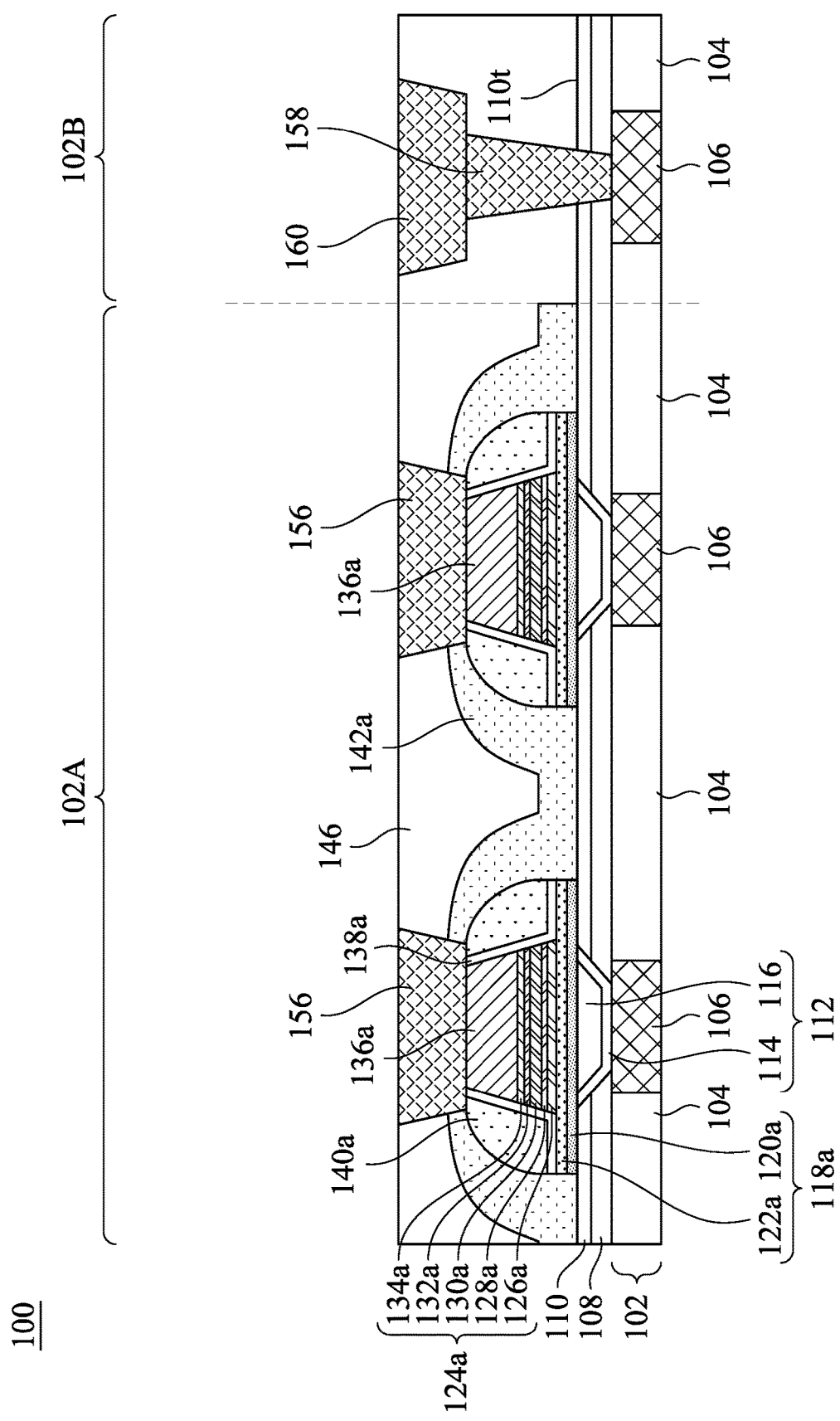

Reference is made to FIG. 18. Upper metallization patterns 156 are then formed in the ILD layer 146. Formation of the upper metallization patterns 156 may be formed by etching an opening in the ILD layer 146, and then filling one or more metals in the opening to form the upper metallization patterns 156, so that the upper metallization patterns 156 can reach on the top electrode 136a. The upper metallization pattern 156 is over the top electrode 136a and has a bottom surface in contact with the spacers 140a. A conductive via 158 and a top conductive line 160 are formed in the ILD layer 146 over the logic device region 102B by suitable processes such as plating, chemical vapor deposition (CVD), physical vapor deposition (PVD) and/or the like, and then removing the conductive material layer outside the ILD layer 146 by suitable processes such as CMP, etching and/or the like. The topography-smoothing layer 142a has a top surface higher than bottom surfaces of the upper metallization patterns 156.

FIG. 19 illustrates an integrated circuit including MRAM devices and logic devices. The integrated circuit includes a logic region 900 and a MRAM region 910. Logic region 900 include circuitry, such as the exemplary transistor, for processing information received from MRAM devices 904 in the MRAM region 910 and for controlling reading and writing functions of the MRAM devices 904. As depicted, the integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with M1 connecting the stack to a source/drain contact of logic transistor 902. The MRAM region 910 includes a full metallization stack connecting MRAM devices 904 to transistors 912 in the MRAM region 910, and a partial metallization stack connecting a source line to transistors 912 in the MRAM region 910. MRAM devices 904 are depicted as being fabricated in between the top of the M4 layer and the bottom of the M5 layer. Also included in integrated circuit is a plurality of ILD layers. Six ILD layers, identified as ILD0 through ILD5 are depicted in FIG. 19 as spanning the logic region 900 and the MRAM region 910. The ILD layers may provide electrical insulation as well as structural support for the various features of the integrated circuit during many fabrication process steps. The ILD layers between two metallization layers may include etch stop layers (not shown) therebetween to signaling the termination point of an etching process and protect any underlying layer or layers during the etching process. In one embodiment, an etch stop layer 922 and a first dielectric layer 924 over the etch stop layer 922 are disposed between the MRAM devices 904 and the ILD layer ILD4. In some embodiments, the MRAM device 904 includes an MTJ stack 933, a top electrode 944 over the MTJ stack 933, a bottom electrode 929 under the MTJ stack 933, and a BEVA 925 under the bottom electrode 929. The bottom electrode 929 includes a TiN layer 930 and a TaN layer 932. The BEVA 925 includes a barrier layer 926 and a filling metal 928.

The MRAM device 904 includes spacers 946 and 948 surrounding sidewalls of the top electrode 944 and sidewalls of the MTJ stack 933. A dielectric layer 950 extends from a top surface of the first dielectric layer 924 and extends along sidewalls of the bottom electrode 929, sidewalls of the spacers 946 and 948. The dielectric layer 950 allows the portion of the ILD layer ILD5 between the neighboring MTJ stacks 933 have a uniform top surface.

Based on the above discussions, it can be seen that the present disclosure offers advantages. It is understood, however, that other embodiments may offer additional advantages, and not all advantageous are necessarily disclosed herein, and that no particular advantage is required for all embodiments. One advantage is that a coating quality of a barrier layer over the ILD layer can be improved. Another advantage is that a process window during forming a via within the ILD layer over the top electrode would not be reduced. Yet another advantage is that concave defects would not be formed after planarizing the ILD layer which is over the MTJ stack.

In some embodiments, a magnetic random access memory (MRAM) device includes a substrate, a first bottom electrode, a first MTJ stack, a first spacer, a topography-smoothing layer and a second inter-layer dielectric (ILD) layer. The substrate includes a first inter-layer dielectric (ILD) layer having a metal line. The first bottom electrode is over the metal line. The first MTJ stack is over the first bottom electrode and includes a pinned layer, a tunnel barrier layer and a free layer. The tunnel barrier layer is over the pinned layer. The free layer is over the tunnel barrier layer. The first spacer surrounds sidewalls of the first MTJ stack. The topography-smoothing layer extends over a top surface of the first ILD layer, along a sidewall of the first bottom electrode and along a sidewall of the first spacer. The topography-smoothing layer has a top portion over the first MTJ stack and a first side portion laterally surrounding the first spacer. The first side portion has a maximal lateral thickness greater than a maximal vertical thickness of the top portion. The second ILD layer is over the topography-smoothing layer. The second ILD layer has a material different from a material of the topography-smoothing layer. In some embodiments, the topography-smoothing layer has a recessed region, and the second ILD layer has a portion embedded in the recessed region. In some embodiments, the portion of the second ILD layer has a width decreasing in a direction toward the substrate. In some embodiments, the topography-smoothing layer is in contact with the first spacer and the second ILD layer. In some embodiments, the topography-smoothing layer has a bottom portion under the first side portion, the bottom portion has a maximal vertical thickness greater than the maximal vertical thickness of the top portion. In some embodiments, the device further includes a second bottom electrode, a second MTJ stack and a second spacer. The second bottom electrode is beside the first bottom electrode. The second MTJ stack is beside the first MTJ stack and over the second bottom electrode. The second spacer surrounds sidewalls of the second MTJ stack. The topography-smoothing layer has a second side portion laterally surrounding the second spacer. The second side portion, the bottom portion and the first side portion in combination form a U-shaped cross-section. In some embodiments, the first bottom electrode and the second bottom electrode have a spacing along a horizontal direction. A ratio of the maximal lateral thickness of the first side portion to the spacing equals to about 0.01 to about 1. In some embodiments, the second ILD layer and the topography-smoothing layer have a bottommost interface at an elevation higher than a top surface of the first bottom electrode. In some embodiments, the device further includes a top electrode and an upper metallization pattern. The top electrode is over the first MTJ stack. The upper metallization pattern is formed within the second ILD layer. The upper metallization pattern is over the top electrode and has a bottom surface in contact with the first spacer.

In some embodiments, a magnetic random access memory (MRAM) device includes a substrate, a bottom electrode, a MTJ stack, a spacer, a topography-smoothing layer and a second inter-layer dielectric (ILD) layer. The substrate includes a first inter-layer dielectric (ILD) layer having a first metal line. The substrate has a memory region and a logic region beside the memory region. The bottom electrode is over the first metal line. The MTJ stack is over the bottom electrode and includes a pinned layer, a tunnel barrier layer and a free layer. The tunnel barrier layer is over the pinned layer. The free layer is over the tunnel barrier layer. The spacer surrounds sidewalls of the MTJ stack. The topography-smoothing layer surrounds the MTJ stack. The second inter-layer dielectric (ILD) layer is over the first ILD layer. The second ILD layer has a first portion over the memory region and a second portion over the logic region. The first portion has a bottommost surface at an elevation higher than a bottommost surface of the second portion. In some embodiments, the topography-smoothing layer is absent from the logic region. In some embodiments, the topography-smoothing layer is in contact with the spacer and the bottom electrode. In some embodiments, the topography-smoothing layer has a width along a horizontal direction, and the width decreases in a direction away from the substrate. In some embodiments, the device further includes an etch stop layer on the memory region and the logic region of the substrate. The substrate and the topography-smoothing layer are spaced apart by the etch stop layer. In some embodiments, the topography-smoothing layer is in contact with the first portion of the second ILD layer. In some embodiments, the device further includes a top electrode and a second metal line. The top electrode is over the MTJ stack. The second metal line is over the top electrode. The second metal line is in contact with the topography-smoothing layer. In some embodiments, the topography-smoothing layer has a top surface higher than a bottom surface of the second metal line.

In some embodiments, a method of forming a magnetic random access memory (MRAM) device includes forming a dielectric layer over a substrate comprising an inter-layer dielectric (ILD) layer having a metal line therein, in which the substrate includes a memory region and a logic region beside the memory region, forming a bottom electrode over the dielectric layer, forming a magnetic tunnel junction (MTJ) stack over the bottom electrode, forming a topography-smoothing material covering the MTJ stack and covering the dielectric layer on the logic region, removing a first portion of the topography-smoothing material on the logic region to expose the dielectric layer while a second portion of the topography-smoothing material remains on the memory region, and forming a second ILD layer over the second portion of the topography-smoothing material. In some embodiments, the method further includes before removing the first portion of the topography-smoothing material, thinning the topography-smoothing material. In some embodiments, thinning the topography-smoothing material is performed such that the topography-smoothing material has a vertical thickness less than a lateral thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic random access memory (MRAM) device, comprising:
   a substrate comprising a first inter-layer dielectric (ILD) layer having a metal line;
   a first bottom electrode over the metal line;
   a first MTJ stack over the first bottom electrode, comprising:
   a pinned layer;
   a tunnel barrier layer over the pinned layer; and
   a free layer over the tunnel barrier layer;
   a first spacer surrounding sidewalls of the first MTJ stack;
   a topography-smoothing layer extending over a top surface of the first ILD layer, along a sidewall of the first bottom electrode and along a sidewall of the first spacer, wherein the topography-smoothing layer has a top portion over the first MTJ stack and a first side portion laterally surrounding the first spacer, and the first side portion has a maximal lateral thickness greater than a maximal vertical thickness of the top portion; and
   a second inter-layer dielectric (ILD) layer over the topography-smoothing layer, wherein the second ILD layer has a material different from a material of the topography-smoothing layer.

2. The device of claim 1, wherein the topography-smoothing layer has a recessed region, and the second ILD layer has a portion embedded in the recessed region.

3. The device of claim 2, wherein the portion of the second ILD layer has a width decreasing in a direction toward the substrate.

4. The device of claim 2, wherein the topography-smoothing layer is in contact with the first spacer and the second ILD layer.

5. The device of claim 2, wherein the topography-smoothing layer has a bottom portion under the first side portion, the bottom portion has a maximal vertical thickness greater than the maximal vertical thickness of the top portion.

6. The device of claim 5, further comprising:
   a second bottom electrode beside the first bottom electrode;
   a second MTJ stack beside the first MTJ stack and over the second bottom electrode; and
   a second spacer surrounding sidewalls of the second MTJ stack, wherein the topography-smoothing layer has a second side portion laterally surrounding the second spacer, and the second side portion, the bottom portion and the first side portion in combination form a U-shaped cross-section.

7. The device of claim 6, wherein the first bottom electrode and the second bottom electrode have a spacing along a horizontal direction, and a ratio of the maximal lateral thickness of the first side portion to the spacing equals to about 0.01 to about 1.

8. The device of claim 1, wherein the second ILD layer and the topography-smoothing layer have a bottommost interface at an elevation higher than a top surface of the first bottom electrode.

9. The device of claim 1, further comprising:
   a top electrode over the first MTJ stack; and
   an upper metallization pattern formed within the second ILD layer, wherein the upper metallization pattern is over the top electrode and has a bottom surface in contact with the first spacer.

10. A magnetic random access memory (MRAM) device, comprising:
    a substrate comprising a first inter-layer dielectric (ILD) layer having a first metal line, the substrate having a memory region and a logic region beside the memory region;

a bottom electrode over the first metal line;
a MTJ stack over the bottom electrode, comprising:
   a pinned layer;
   a tunnel barrier layer over the pinned layer; and
   a free layer over the tunnel barrier layer;
a spacer surrounding sidewalls of the MTJ stack;
a topography-smoothing layer surrounding the MTJ stack, wherein the topography-smoothing layer is absent from the logic region; and
a second inter-layer dielectric (ILD) layer over the first ILD layer, wherein the second ILD layer has a first portion over the memory region and a second portion over the logic region, the first portion has a bottommost surface at an elevation higher than a bottommost surface of the second portion.

11. The device of claim 10, wherein the topography-smoothing layer is in contact with the spacer and the bottom electrode.

12. The device of claim 10, wherein the topography-smoothing layer has a width along a horizontal direction, and the width decreases in a direction away from the substrate.

13. The device of claim 10, further comprising:
an etch stop layer on the memory region and the logic region of the substrate, wherein the substrate and the topography-smoothing layer are spaced apart by the etch stop layer.

14. The device of claim 10, wherein the topography-smoothing layer is in contact with the first portion of the second ILD layer.

15. The device of claim 10, further comprising:
a top electrode over the MTJ stack; and
a second metal line over the top electrode, wherein the second metal line is in contact with the topography-smoothing layer.

16. The device of claim 15, wherein the topography-smoothing layer has a top surface higher than a bottom surface of the second metal line.

17. A method of forming a magnetic random access memory (MRAM) device, the method comprising:
forming a dielectric layer over a substrate comprising an inter-layer dielectric (ILD) layer having a metal line therein, wherein the substrate includes a memory region and a logic region beside the memory region;
forming a bottom electrode over the dielectric layer;
forming a magnetic tunnel junction (MTJ) stack over the bottom electrode;
forming a topography-smoothing material covering the MTJ stack and covering the dielectric layer on the logic region;
removing a first portion of the topography-smoothing material on the logic region to expose the dielectric layer while a second portion of the topography-smoothing material remains on the memory region; and
forming a second ILD layer over the second portion of the topography-smoothing material.

18. The method of claim 17, further comprising:
before removing the first portion of the topography-smoothing material, thinning the topography-smoothing material.

19. The method of claim 18, wherein thinning the topography-smoothing material is performed such that the topography-smoothing material has a vertical thickness less than a lateral thickness.

20. The device of claim 10, wherein the topography-smoothing layer has opposite curved sidewalls on opposite sides of the MTJ stack, respectively.

* * * * *